(12) United States Patent
Nakamura et al.

(10) Patent No.: US 10,938,371 B2
(45) Date of Patent: Mar. 2, 2021

(54) ACOUSTIC WAVE RESONATOR, FILTER, AND MULTIPLEXER

(71) Applicant: TAIYO YUDEN CO., LTD., Tokyo (JP)

(72) Inventors: Kentaro Nakamura, Tokyo (JP); Fumiya Matsukura, Tokyo (JP); Satoshi Imasu, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 496 days.

(21) Appl. No.: 15/958,756

(22) Filed: Apr. 20, 2018

(65) Prior Publication Data

US 2018/0316333 A1 Nov. 1, 2018

(30) Foreign Application Priority Data

May 1, 2017 (JP) .............................. JP2017-091381

(51) Int. Cl.
*H03H 9/02* (2006.01)
*H03H 9/145* (2006.01)
*H03H 9/25* (2006.01)
*H01L 41/047* (2006.01)
*H03H 9/13* (2006.01)
(Continued)

(52) U.S. Cl.
CPC ....... *H03H 9/02559* (2013.01); *H01L 41/047* (2013.01); *H03H 9/02834* (2013.01); *H03H 9/02858* (2013.01); *H03H 9/02992* (2013.01); *H03H 9/131* (2013.01); *H03H 9/14541* (2013.01); *H03H 9/14552* (2013.01);
(Continued)

(58) Field of Classification Search
CPC .......... H03H 9/02559; H03H 9/02834; H03H 9/02992; H03H 9/131; H03H 9/14541; H03H 9/14552
USPC ...... 310/313 R, 313 A, 313 B, 313 C, 313 D
See application file for complete search history.

(56) References Cited

U.S. PATENT DOCUMENTS

2011/0068655 A1 3/2011 Solal et al.
2012/0313483 A1* 12/2012 Matsuda ............. H03H 9/6483
310/313 C
(Continued)

FOREIGN PATENT DOCUMENTS

JP 2005-260296 A 9/2005
JP 2011-101350 A 5/2011
(Continued)

*Primary Examiner* — Derek J Rosenau
(74) *Attorney, Agent, or Firm* — Chen Yoshimura LLP

(57) ABSTRACT

An acoustic wave resonator includes: an IDT located on a piezoelectric substrate, including comb-shaped electrodes facing each other and including electrode fingers and a bus bar connecting the electrode fingers; a first silicon oxide film located on the electrode fingers in an overlap region where the electrode fingers overlap and having a film thickness in a part of edge regions, which correspond to both ends of the overlap region, equal to or less than that in a center region sandwiched between the edge regions; and a second silicon oxide film located on the electrode fingers, containing an element slowing an acoustic velocity in a silicon oxide film when being added to the silicon oxide film, having a concentration of the element greater than that in the first silicon oxide film, and having a film thickness in a part of the edge regions greater than that in the center region.

16 Claims, 22 Drawing Sheets

(51) Int. Cl.
*H03H 9/54* (2006.01)
*H03H 9/64* (2006.01)

(52) U.S. Cl.
CPC ............... *H03H 9/25* (2013.01); *H03H 9/54* (2013.01); *H03H 9/64* (2013.01); *H03H 9/6483* (2013.01)

(56) References Cited

U.S. PATENT DOCUMENTS

| | | |
|---|---|---|
| 2013/0049533 A1 | 2/2013 | Matsuda et al. |
| 2013/0099630 A1 | 4/2013 | Matsuda et al. |
| 2013/0162368 A1* | 6/2013 | Tsurunari ................ H03H 9/25 333/133 |
| 2013/0249647 A1 | 9/2013 | Nakanishi et al. |
| 2017/0279433 A1 | 9/2017 | Matsukura et al. |
| 2018/0102760 A1* | 4/2018 | Inoue ................ H03H 9/14558 |

FOREIGN PATENT DOCUMENTS

| | | |
|---|---|---|
| JP | 2013-055371 A | 3/2013 |
| JP | 2013-544041 A | 12/2013 |
| JP | 2017-175276 A | 9/2017 |
| WO | 2012/029354 A1 | 3/2012 |

* cited by examiner

| MATERIAL OF ADDITIONAL FILM | ACOUSTIC VELOCITY [m/s] |
|---|---|
| SILICON DIOXIDE ($SiO_2$) | 3593.81 |
| NIOBIUM OXIDE ($NbO_x$) | 3399.40 |
| TANTALUM OXIDE ($TaO_x$) | 2932.03 |
| TUNGSTEN OXIDE ($WO_x$) | 2622.68 |

| F CONCENTRATION [at%] | ACOUSTIC VELOCITY [m/s] |
|---|---|
| 0.0 | 3593.81 |
| 1.7 | 3537.48 |
| 3.0 | 3326.53 |
| 4.9 | 2982.60 |
| 7.0 | 2879.36 |
| 9.0 | 2612.34 |
| 11.0 | 2301.49 |

FIG. 11

| F CONCENTRATION [at%] | RESONANT FREQUENCY [MHz] | SAW ACOUSTIC VELOCITY [m/s] | TCF(fr) [ppm/°C] |
|---|---|---|---|
| 0.00 | 1749.19 | 3498.39 | -15.72 |
| 1.70 | 1721.81 | 3443.61 | -10.17 |
| 3.00 | 1702.53 | 3405.06 | -4.65 |
| 4.90 | 1676.50 | 3353.00 | 17.47 |

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2017-091381, filed on May 1, 2017, the entire contents of which are incorporated herein by reference.

FIELD

A certain aspect of the present invention relates to an acoustic wave resonator, a filter, and a multiplexer.

BACKGROUND

In high frequency communication systems as typified by mobile phones, high-frequency filters have been used to remove unnecessary signals other than signals in the frequency band used for communication. Used for the high-frequency filters are acoustic wave resonators such as surface acoustic wave (SAW) resonators. In the SAW resonator, an interdigital transducer (IDT) having electrode fingers is formed on a piezoelectric substrate.

Many piezoelectric substances have negative temperature coefficients of elastic moduli. Silicon oxide ($SiO_2$) has a positive temperature coefficient of elastic modulus. Thus, a surface acoustic wave resonator having a good temperature characteristic is achieved by forming a silicon oxide film on the piezoelectric substrate so as to cover the IDT as disclosed in, for example, International Publication No. 2012/029354. In the surface acoustic wave resonator, lateral-mode spurious may occur. To reduce lateral-mode spurious, it has been known that the acoustic velocity in the edge region within the overlap region of the IDT is made to be less than that in the center region as disclosed in, for example, Japanese Patent Application Publication Nos. 2013-544041 and 2011-101350. Such a structure is called a piston mode.

SUMMARY OF THE INVENTION

According to the first aspect of the present invention, there is provided an acoustic wave resonator including: a piezoelectric substrate; an IDT that is located on the piezoelectric substrate, and includes a pair of comb-shaped electrodes facing each other, each of the pair of comb-shaped electrodes including electrode fingers, which excite an acoustic wave, and a bus bar connecting the electrode fingers; a first silicon oxide film located on the electrode fingers in an overlap region where the electrode fingers of the pair of comb-shaped electrodes overlap, a film thickness of the first silicon oxide film in at least a part of at least one of edge regions being equal to or less than a film thickness of the first silicon oxide film in a center region, the edge regions corresponding to both ends of the overlap region in an extension direction of the electrode fingers, the center region being sandwiched between the edge regions within the overlap region; and a second silicon oxide film that is located on the electrode fingers in the overlap region and contains an element or molecule that slows an acoustic velocity in a silicon oxide film when being added to the silicon oxide film, a concentration of the element or molecule in the second silicon oxide film being greater than that in the first silicon oxide film, and a film thickness of the second silicon oxide film in at least a part of at least one of the edge regions being greater than a film thickness of the second silicon oxide film in the center region.

According to the second aspect of the present invention, there is provided a filter including the above acoustic wave resonator.

According to the third aspect of the present invention, there is provided a multiplexer including the above filter.

BRIEF DESCRIPTION OF THE DRAWINGS

FIG. 11 presents the characteristics of acoustic wave resonators in accordance with a fifth comparative example;

DETAILED DESCRIPTION

Hereinafter, with reference to the drawings, embodiments of the present invention will be described.

First Embodiment

Figure 1A:
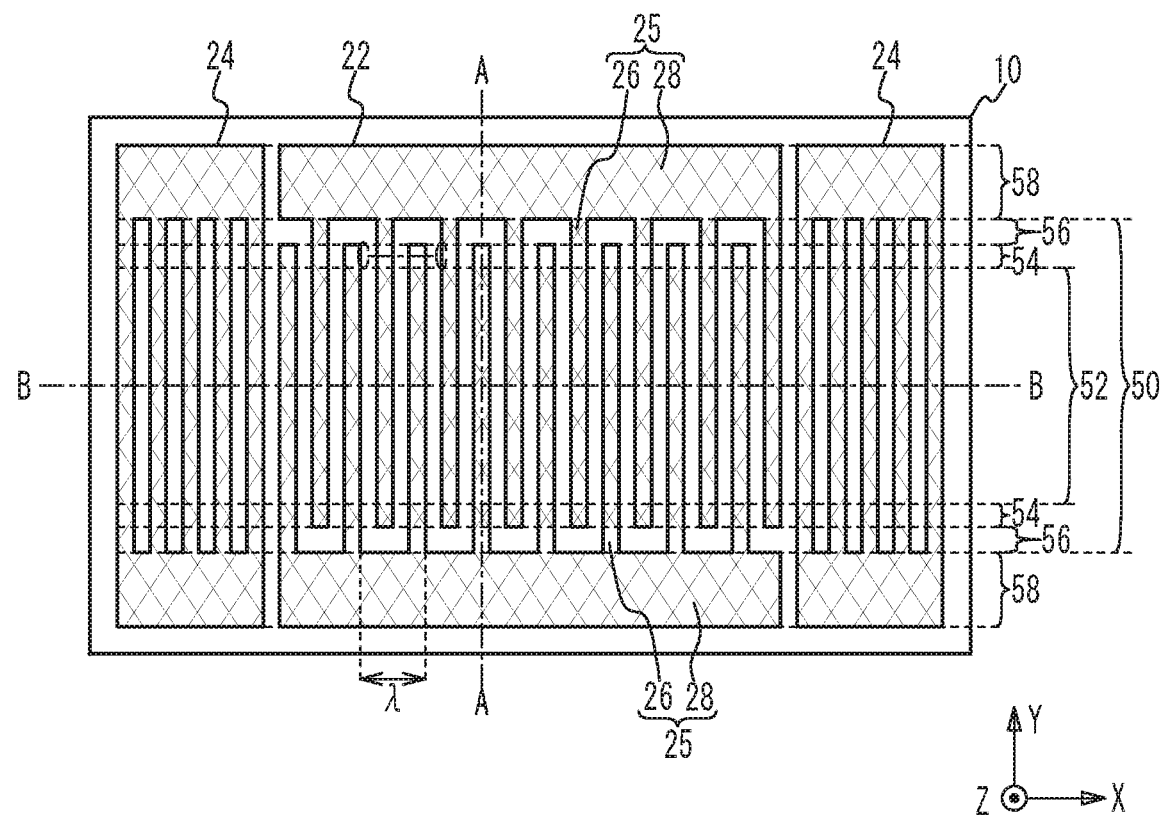
FIG. 1A is a plan view of an acoustic wave resonator in accordance with a first embodiment.
Figure 1B:
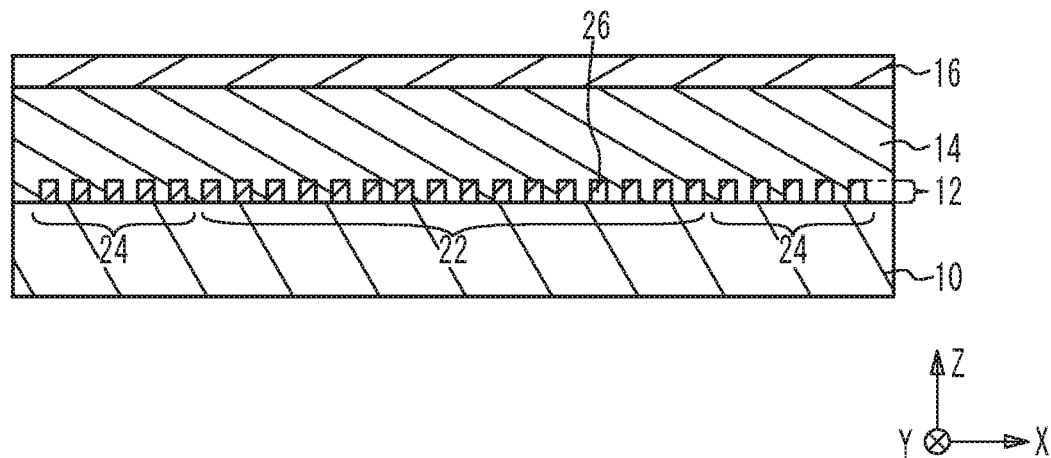
FIG. 1B is a cross-sectional view taken along line B-B in FIG. 1A.

FIG. 1A is a plan view of an acoustic wave resonator in accordance with a first embodiment, and FIG. 1B is a cross-sectional view taken along line B-B in FIG. 1A. In FIG. 1A, the illustration of a silicon oxide film is omitted. The propagation direction of an acoustic wave is defined as an X direction, the direction perpendicular to the X direction in the plane of a piezoelectric substrate is defined as a Y direction, and the normal direction of the upper surface of the piezoelectric substrate is defined as a Z direction. The X direction, the Y direction, and the Z direction do not necessarily correspond to the X-axis orientation, the Y-axis orientation, and the Z-axis orientation in the crystal orientation of a piezoelectric substrate 10, respectively.

As illustrated in FIG. 1A and FIG. 1B, an interdigital transducer (IDT) 22 and reflectors 24 are formed on the piezoelectric substrate 10. The IDT 22 and the reflectors 24 are formed of a metal film 12 formed on the piezoelectric substrate 10. The IDT 22 includes a pair of comb-shaped electrodes 25 facing each other. The comb-shaped electrode 25 includes electrode fingers 26 and a bus bar 28 to which the electrode fingers 26 are coupled. A pair of comb-shaped electrodes 25 are located to face each other so that the electrode fingers 26 of one of the comb-shaped electrodes 25 and the electrode fingers 26 of the other of the comb-shaped electrodes 25 are substantially alternately arranged.

The region where the electrode fingers 26 of a pair of comb-shaped electrodes 25 overlap is an overlap region 50. In the overlap region 50, the acoustic wave excited by the electrode fingers 26 mainly propagates in the arrangement direction of the electrode fingers 26 (the X direction). The pitch λ of the electrode fingers 26 substantially corresponds to the wavelength of the acoustic wave. In the overlap region 50, the regions located at the both ends of the overlap region 50 in the Y direction, in which the electrode fingers 26 extend, are edge regions 54, and the region sandwiched between the edge regions 54 is a center region 52. The region between the tips of the electrode fingers 26 of one of the comb-shaped electrodes 25 and the bus bar 28 of the other of the comb-shaped electrodes 25 is a gap region 56. When dummy electrode fingers are provided, the gap region is a region between the tips of the electrode fingers of one of the comb-shaped electrodes 25 and the tips of the dummy electrode fingers of the other of the comb-shaped electrodes 25. The region where the bus bar 28 is located is a bus bar region 58.

A silicon oxide film 14 is located on the piezoelectric substrate 10 so as to cover the electrode fingers 26. A silicon oxide film 16 is located on the silicon oxide film 14. The piezoelectric substrate 10 is, for example, a lithium tantalate substrate or a lithium niobate substrate. The metal film 12 is a film mainly composed of, for example, aluminum or copper. Another element or molecule may not be necessarily intentionally added to the silicon oxide film 14, or an element or molecule such as fluorine that slows the acoustic velocity may be added. An element or molecule such as fluorine that slows the acoustic velocity is added to the silicon oxide film 16. The concentration of the element or molecule that slows the acoustic velocity in the silicon oxide film 16 is greater than that in the silicon oxide film 14.

Figure 2A:
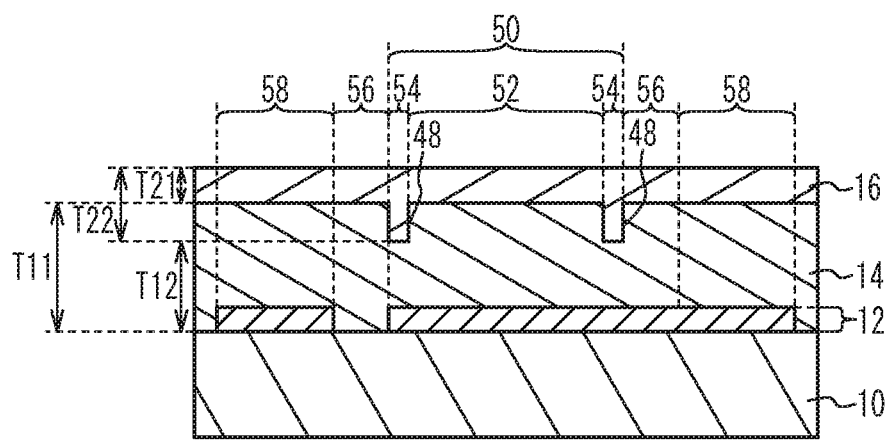
FIG. 2A is a cross-sectional view taken along line A-A in FIG. 1A, and FIG. 2B and FIG. 2C are X-direction cross-sectional views of a center region and an edge region, respectively.
Figure 2A:
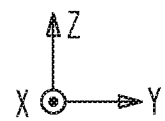
Figure 2B:
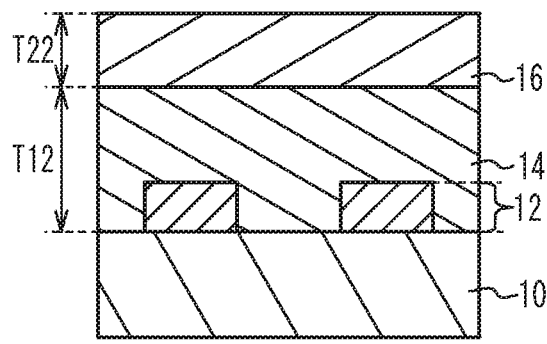
Figure 2B:
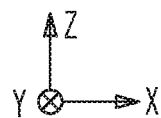
Figure 2C:
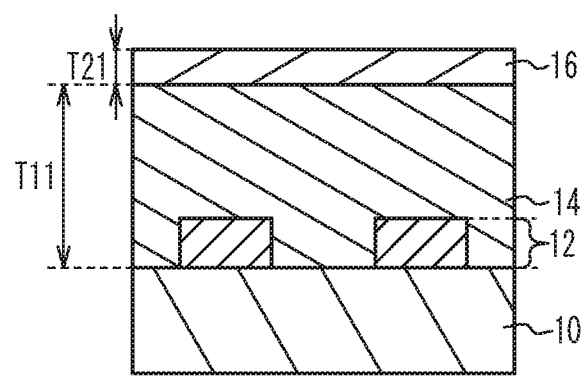
Figure 2C:
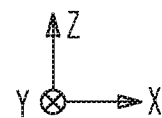

FIG. 2A is a cross-sectional view taken along line A-A in FIG. 1A, and FIG. 2B and FIG. 2C are X-direction cross-sectional views of the center region and the edge region, respectively. As illustrated in FIG. 2A through FIG. 2C, the upper surface of the silicon oxide film 14 has recessed portions 48 in the edge regions 54. Because of this structure, the film thickness T12 of the silicon oxide film 14 in the edge region 54 is less than the film thickness T11 of the silicon oxide film 14 in the center region 52. The film thickness T22 of the silicon oxide film 16 in the edge region 54 is greater than the film thickness T21 of the silicon oxide film 16 in the center region 52. The upper surface of the silicon oxide film 16 is substantially flat. That is, the film thickness T12+T22 in the edge region 54 is approximately equal to the film thickness T11+T21 in the center region 52. The film thicknesses T11 and T12 are defined as the film thicknesses from the upper surface of the piezoelectric substrate 10 to the upper surface of the silicon oxide film 14, but may be the film thicknesses from the upper surface of the metal film 12 to the upper surface of the silicon oxide film 14.

Fabrication Method of the First Embodiment

Figure 3A:
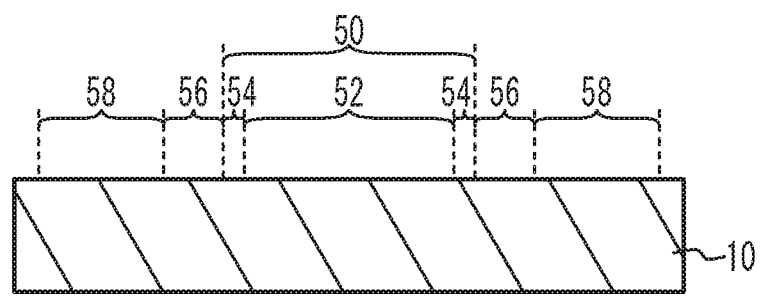
FIG. 3A through FIG. 3C are cross-sectional views illustrating a method of fabricating the acoustic wave resonator in accordance with the first embodiment (No. 1)

FIG. 3A through FIG. 4C are cross-sectional views illustrating a method of fabricating the acoustic wave resonator in accordance with the first embodiment. As illustrated in FIG. 3A, the piezoelectric substrate 10 is prepared. Used as the piezoelectric substrate 10 is a lithium niobate substrate or a lithium tantalate substrate. When the piezoelectric substrate 10 is a lithium niobate substrate, for example, a rotated Y-cut lithium niobate substrate is used. When the rotated Y-cut angle is 127.86°, the electromechanical coupling coefficient of the Rayleigh wave becomes maximum. According to the simulation using the Campbell & Jones method, when the rotated Y-cut angle is within a range from 120° to 140°, the electromechanical coupling coefficient of the Rayleigh wave is greater than the electromechanical coupling coefficient of the leaky wave. Accordingly, the Rayleigh wave is a primary mode, and the leaky wave is an unnecessary wave. When the Rayleigh wave is a primary mode, the rotated Y-cut angle is preferably 120° or greater and 140° or less. For 127.86°, the rotated Y-cut angle is preferably 126° or greater and 130° or less in consideration of the variation in production.

In the lithium niobate substrate, when the rotated Y-cut angle is 0°, the electromechanical coupling coefficient of the leaky wave becomes maximum. When the rotated Y-cut angle is within a range from −10° to 10°, the electromechanical coupling coefficient of the leaky wave is greater than the electromechanical coupling coefficient of the Rayleigh wave. Accordingly, the leaky wave is a primary mode, and the Rayleigh wave is an unnecessary wave. When the leaky wave is a primary mode, the rotated Y-cut angle is preferably −10° or greater and 10° or less. Additionally, in consideration of the variation in production, the rotated Y-cut angle is preferably −3° or greater and 3° or less.

Figure 3B:
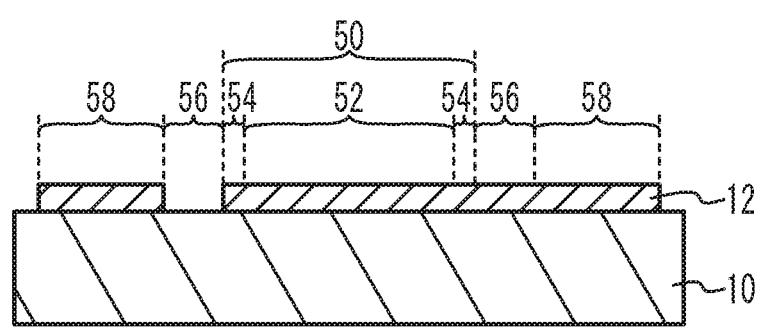

As illustrated in FIG. 3B, the metal film 12 is formed on the piezoelectric substrate 10. The metal film 12 is a copper film, an aluminum film, or a ruthenium film, or an alloy film mainly composed of one of them, or a multilayered film of at least two of them. The metal film 12 is processed by, for example, evaporation and liftoff, or sputtering and etching to form the IDT 22 and the reflectors 24. A diffusion prevention film having a substantially uniform film thickness and being thinner than the metal film 12 may be provided so as to cover the metal film 12. For the diffusion prevention film, for example, silicon nitride, silicon carbide, aluminum oxide, tantalum oxide, and/or niobium oxide can be used.

Figure 3C:
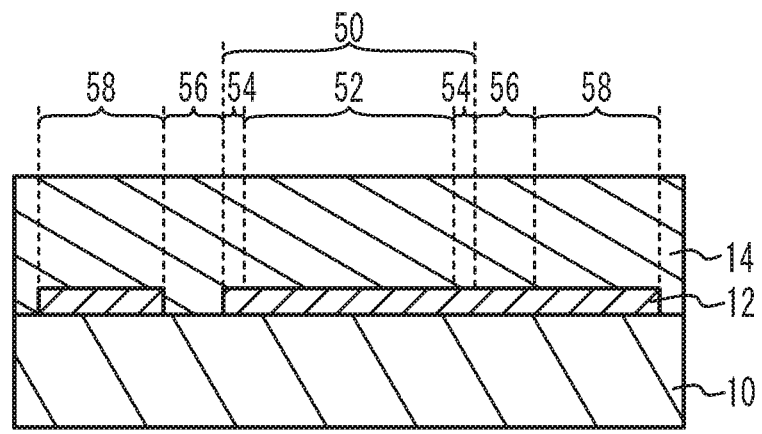

As illustrated in FIG. 3C, the silicon oxide film 14 is formed on the piezoelectric substrate 10. An element or molecule such as fluorine may be added or may not be necessarily added to the silicon oxide film 14. The silicon oxide film 14 is formed by chemical vapor deposition (CVD) using, for example, a mixed gas of $SiH_4$, $N_2O$, and $C_2F_6$ or a mixed gas of Tetraethyl orthosilicate (TEOS), $O_2$, and $C_2F_6$ for the material gas. The film thickness of the silicon oxide film 14 is greater than the film thickness of the metal film 12. The upper surface of the silicon oxide film 14 is planarized by chemical mechanical polishing (CMP).

Figure 4A:
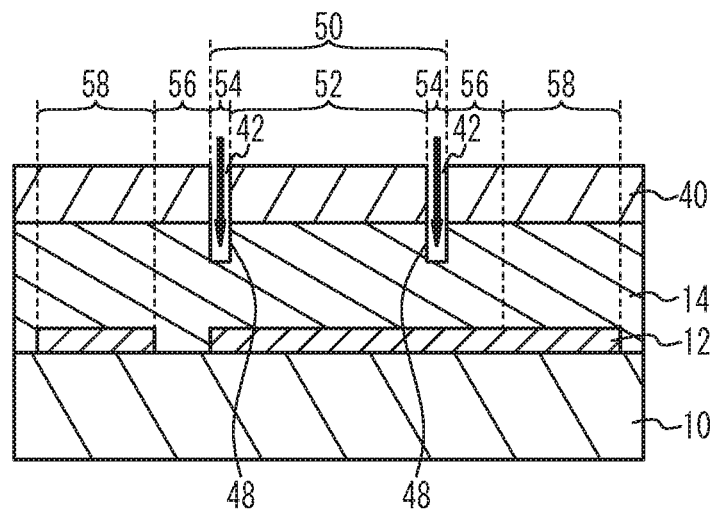
FIG. 4A through FIG. 4C are cross-sectional views illustrating the method of fabricating the acoustic wave resonator in accordance with the first embodiment (No. 2)

As illustrated in FIG. 4A, a mask layer 40 having apertures 42 in the edge regions 54 is formed on the silicon oxide film 14. The mask layer 40 is made of, for example, photoresist. As indicated by arrows, the recessed portions 48 are formed on the upper surface of the silicon oxide film 14 in the edge regions 54 by using the mask layer 40 as a mask. Used for etching the silicon oxide film 14 to form the recessed portions 48 is reactive ion etching using a fluorine-based gas such as, for example, $CF_4$, $CHF_3$, $C_3F_8$, or $SF_6$ as an etching gas or ion milling using Ar or $O_2$.

Figure 4B:
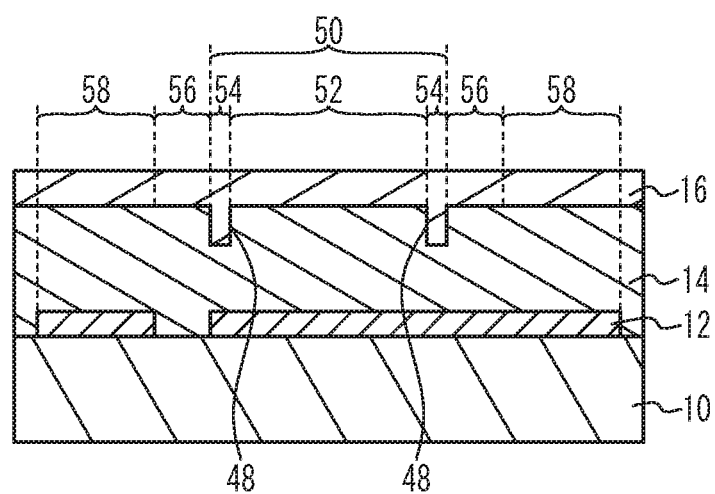

As illustrated in FIG. 4B, the silicon oxide film 16 is formed on the silicon oxide film 14. This process causes the recessed portions 48 to be filled with the silicon oxide film 16. The fluorine concentration in the silicon oxide film 16 is higher than that in the silicon oxide film 14. The silicon oxide film 14 is formed by CVD using, for example, a mixed gas of $SiH_4$, $N_2O$, and $C_2F_6$ or a mixed gas of TEOS, $O_2$, and $C_2F_6$ for the material gas. The upper surface of the silicon oxide film 16 is planarized by CMP.

Figure 4C:
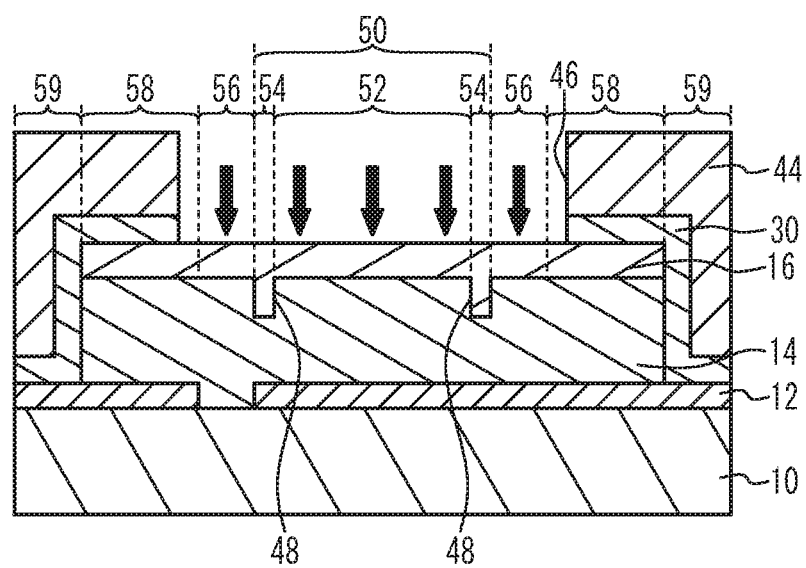

FIG. 4C illustrates pad regions 59 as well as the overlap region 50, the gap regions 56, and the bus bar regions 58. As illustrated in FIG. 4C, the silicon oxide films 14 and 16 in the pad regions 59 are removed to form pad electrodes 30 that are in contact with the metal film 12 in the pad regions 59. A mask layer 44 having an aperture 46 is formed on the silicon oxide film 16 and the pad electrodes 30. The mask layer 44 is made of, for example, photoresist. The silicon oxide film 16 in the overlap region 50 and the gap regions 56 is etched by using the mask layer 44 as a mask (see arrows). The resonant frequency and the antiresonant frequency of the surface acoustic wave resonator are adjusted by controlling the etching amount of the silicon oxide film 16. The silicon oxide film 16 can be etched by the method identical to the method used for etching the silicon oxide film 14 in FIG. 3C.

Figure 5A:
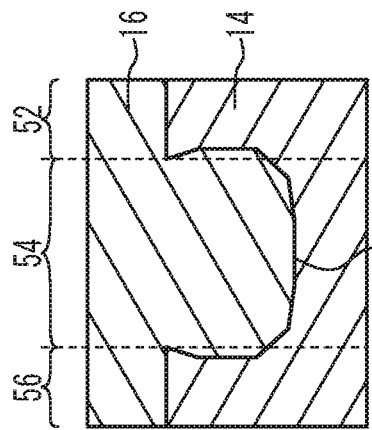
FIG. 5A through FIG. 5C are cross-sectional views illustrating the boundary face of a silicon oxide film in the edge region.
Figure 5B:
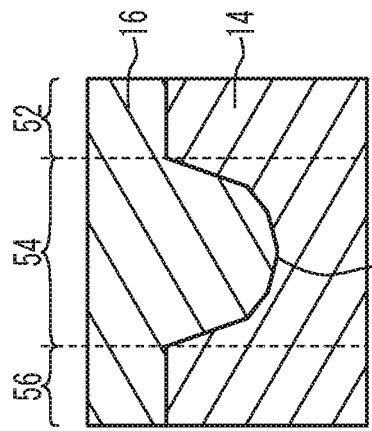
Figure 5C:
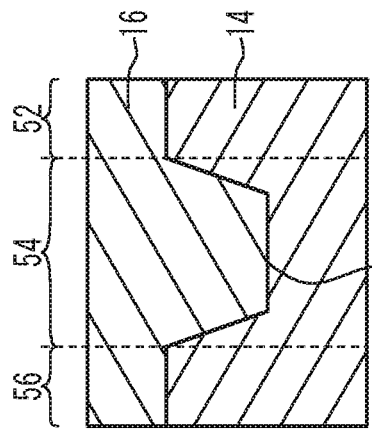
Figure 5D:
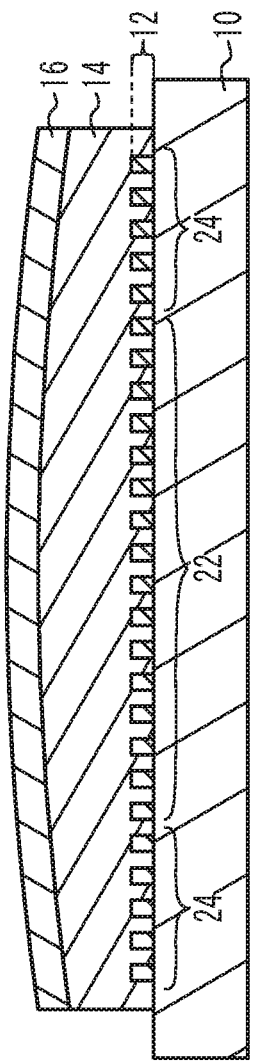
FIG. 5D is a cross-sectional view of the upper surface of the silicon oxide film after CMP.

FIG. 5A through FIG. 5C are cross-sectional views illustrating the boundary face of the silicon oxide film in the edge region, and FIG. 5D is a cross-sectional view of the upper surface of the silicon oxide film after CMP. As illustrated in FIG. 5A through FIG. 5C, when the recessed portion 48 is formed in the silicon oxide film 14, the cross-section of the recessed portion 48 may not become rectangular depending on the etching condition of wet etching or dry etching. In FIG. 5A, the side surface of the recessed portion 48 is slant, and the cross-section of the recessed portion 48 has a trapezoidal shape. In FIG. 5B, the side surface and the bottom surface of the recessed portion 48 are curved. In FIG. 5C, the side surface of the recessed portion 48 is a curved surface having an overhang.

In FIG. 3C, the unevenness, associated with the electrode fingers 26, on the upper surface is planarized by planarizing the upper surface of the silicon oxide film 14. In FIG. 4B, the unevenness, associated with the recessed portions 48, on the upper surface is planarized by planarizing the silicon oxide film 16. As illustrated in FIG. 5D, when the upper surfaces of the silicon oxide films 14 and 16 are planarized by CMP, the upper surfaces may become curved surfaces. However, this curved surface has a very large curvature compared to the unevenness associated with the electrode fingers 26 and/or the recessed portions 48.

Description of a Piston Mode

Figure 6:
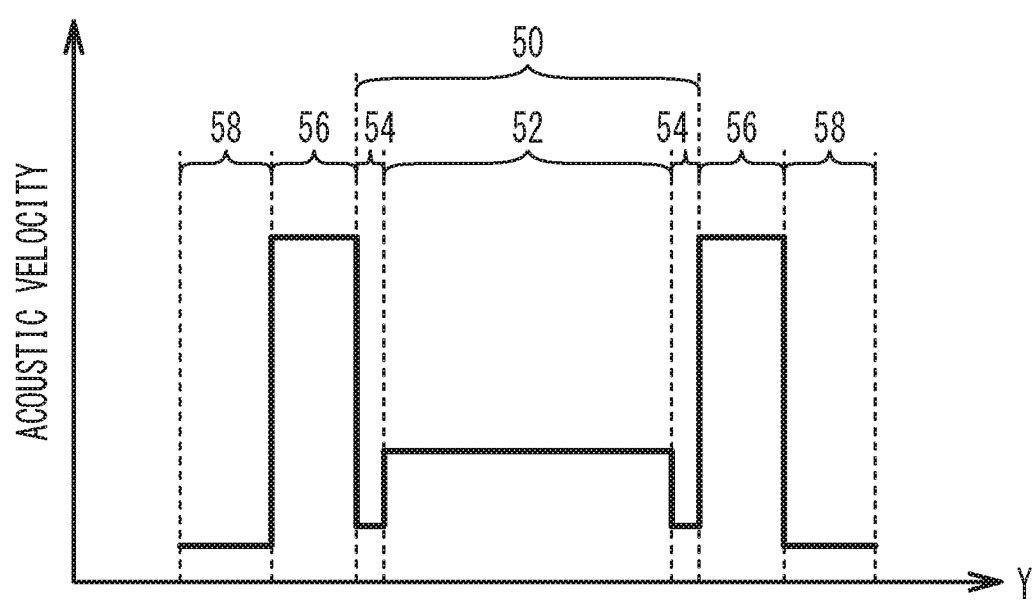
FIG. 6 illustrates acoustic velocity in the cross-section taken along line A-A in FIG. 1A.

FIG. 6 illustrates acoustic velocity in the cross-section taken along line A-A in FIG. 1A. As illustrated in FIG. 6, the acoustic velocity in the gap region 56 is greater than the acoustic velocity in the overlap region 50. Accordingly, the acoustic wave is confined in the overlap region 50. The silicon oxide film 16 contains an element or molecule that slows the acoustic velocity so that the acoustic velocity in the silicon oxide film 16 is less than the acoustic velocity in the silicon oxide film 14. Thus, the acoustic velocity in the edge region 54 is less than the acoustic velocity in the center region 52. Accordingly, the intensity distribution of the fundamental lateral mode in the overlap region 50 becomes flat in the Y direction. Furthermore, the coupling coefficient of a high-order lateral mode becomes smaller. Therefore, the piston mode that reduces lateral-mode spurious is achieved.

FIRST COMPARATIVE EXAMPLE

Figure 7:
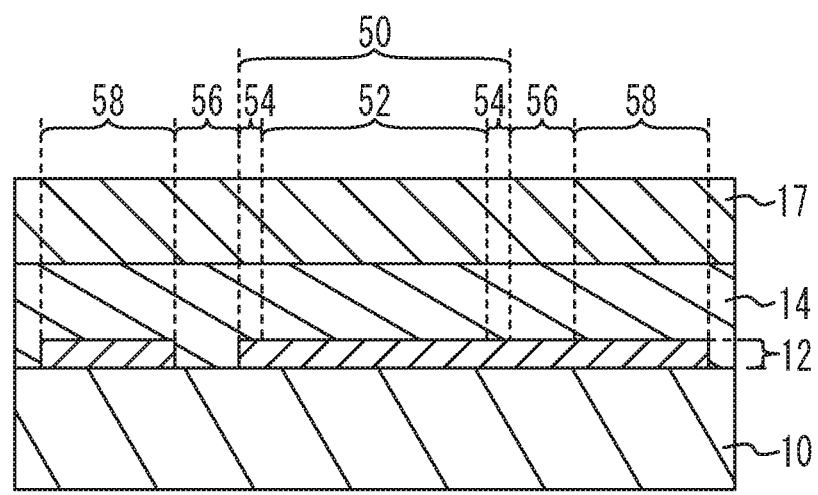
FIG. 7 is a cross-sectional view of a surface acoustic wave resonator in accordance with a first comparative example.

Simulated was the acoustic velocity of the acoustic wave of a surface acoustic wave resonator by using a first comparative example. FIG. 7 is a cross-sectional view of a surface acoustic wave resonator in accordance with the first comparative example. As illustrated in FIG. 7, in the first comparative example, an additional film 17 is located on the silicon oxide film 14. The film thickness of the additional film 17 is the same among the overlap region 50, the gap region 56, and the bus bar region 58. The simulation conditions for the first comparative example are as follows.
Piezoelectric substrate 10: 127.86° rotated Y-cut X-propagation lithium niobate substrate
Metal film 12: Copper film with a film thickness of 278 nm (0.0655λ)
Silicon oxide film 14: The film thickness on the metal film 12 is 956 nm (0.225λ), and fluorine is not added.
IDT 22: The pitch λ is 4.25 µm, the number of pairs is 100 pairs, and the aperture length is 20λ.

Figures 8A, 8B:
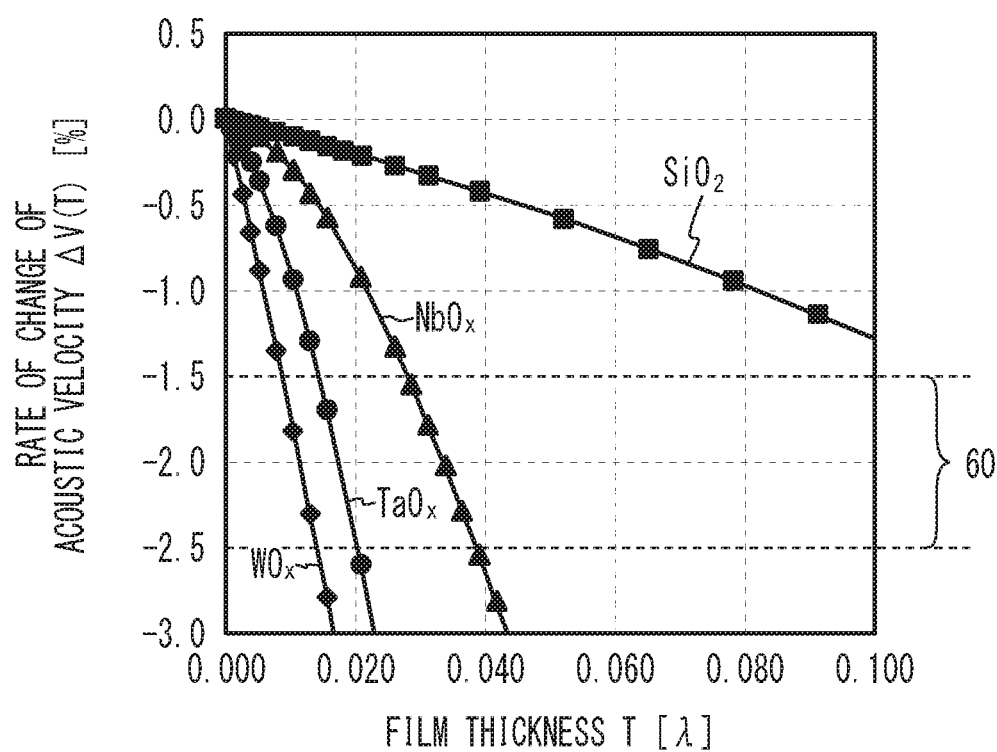
FIG. 8A presents acoustic velocities in respective bulks of the materials used for an additional film of the first comparative example.
FIG. 8B is a graph of a rate of change of the acoustic velocity versus the film thickness of the additional film in the first comparative example.

FIG. 8A presents acoustic velocities in respective bulks of the materials used for the additional film of the first comparative example, and FIG. 8B is a graph of the rate of change of the acoustic velocity versus the film thickness of the additional film normalized by λ in the first comparative example. FIG. 8A presents acoustic velocities of lateral waves in the bulks of respective materials. The rate of change of the acoustic velocity in FIG. 8B is calculated by the rate of change of the resonant frequency. That is, ΔV(T) is calculated by the following expression.

$$\Delta V(T) = \Delta fr(T) = (fr(T) - fr(0))/fr(0) \times 100 \, [\%]$$

Here, fr(0) represents the resonant frequency when no additional film 17 is provided, and fr(T) represents the resonant frequency when the film thickness of the additional film 17 is T.

As presented in FIG. 8A, the acoustic velocities in the bulks of niobium oxide ($NbO_x$), tantalum oxide ($TaO_x$), and tungsten oxide ($WO_x$) are less than the acoustic velocity of silicon dioxide ($SiO_2$).

As illustrated in FIG. 8B, as the film thickness T of the additional film 17 increases, the rate of change of the acoustic velocity ΔV(T) decreases. That is, the acoustic velocity becomes slower. For silicon dioxide, the change of the acoustic velocity is small even when the film thickness is increased. This is because as presented in FIG. 8A, the acoustic velocity in the bulk of silicon dioxide is approximately equal to the acoustic velocity of the surface acoustic wave (for example, 3500 m/s) and the density of silicon dioxide is small. The reason why the change of the acoustic velocity of each of niobium oxide, tantalum oxide, and tungsten oxide is large is because the acoustic velocity in the bulk is slow and the density is large.

To reduce lateral-mode spurious by using the piston mode, the acoustic velocity in the edge region 54 is preferably less than the acoustic velocity in the center region 52 by 1.5% to 2.5% (a range 60). In each of niobium oxide, tantalum oxide, and tungsten oxide, ΔV(T) can be made to be within the range 60 from −1.5% to −2.5% by making the film thickness 0.01λ (30 nm) to 0.039λ (150 nm). In silicon dioxide, the film thickness for making ΔV(T) within the range 60 from −1.5% to −2.5% is 0.1λ (400 nm) or greater (more specifically, 0.11λ to 0.165λ).

SECOND COMPARATIVE EXAMPLE

Figure 9A:
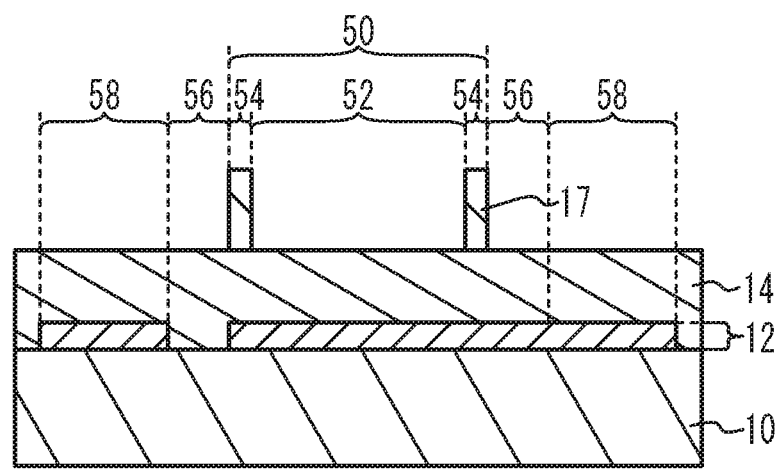
FIG. 9A and FIG. 9B are cross-sectional views of surface acoustic wave resonators in accordance with second and third comparative examples.

A second comparative example will be described based on the result of the first comparative example. FIG. 9A is a cross-sectional view of an acoustic wave resonator in accordance with the second comparative example. As illustrated in FIG. 9A, the additional film 17 is located on the silicon oxide film 14 in the edge regions 54. The additional film 17 is made of silicon dioxide. When the acoustic velocity in the edge region 54 is made to be less than the acoustic velocity in the center region 52 by 1.5% to 2.5% to reduce lateral-mode spurious, the film thickness of the additional film 17 is 0.1λ (400 nm) or greater. The film thickness of the additional film 17 is equal to or greater than one-half of the film thickness of the silicon oxide film 14. The processing of such a thick additional film 17 is not easy. As the unevenness of the surfaces, exposed to the air, of the silicon oxide film 14 and the additional film 17 increases, unnecessary waves such as an SH wave are generated, and the resonator characteristics thereby deteriorate.

THIRD COMPARATIVE EXAMPLE

Figure 9B:
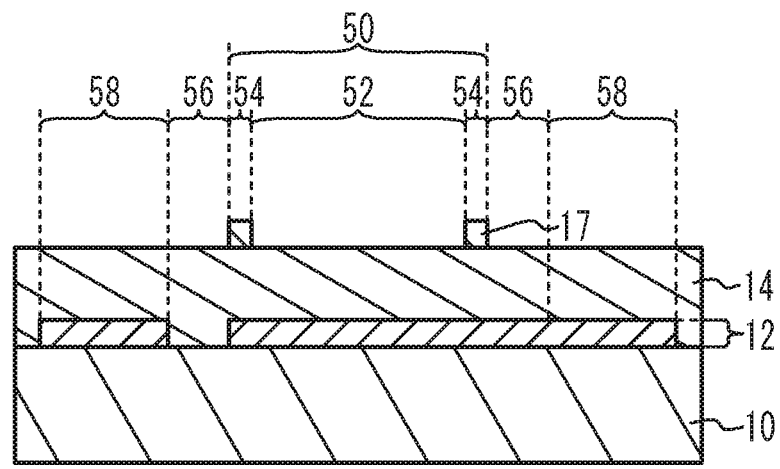

FIG. 9B is a cross-sectional view of an acoustic wave resonator in accordance with a third comparative example. As illustrated in FIG. 9B, the film thickness of the additional film 17 can be made to be, for example, 0.04λ (150 nm) or less by using, for the additional film 17, the material such as niobium oxide, tantalum oxide, tungsten oxide, or tellurium oxide, of which the acoustic velocity in the bulk is slow. Accordingly, the processing of the additional film 17 becomes easier than that in the first comparative example. The unevenness of the uppermost surfaces, exposed to the air, of the silicon oxide film 14 and the additional film 17 becomes smaller. Thus, unnecessary waves due to the unevenness are reduced.

The silicon oxide film 14 is provided to improve the temperature characteristic of the surface acoustic wave resonator. The temperature coefficient of the elastic modulus of the piezoelectric substance is negative, and the temperature coefficient of the elastic modulus of silicon oxide is positive. Thus, the provision of the silicon oxide film 14 on the piezoelectric substrate 10 enables to make the temperature coefficient of frequency (TCF) of the surface acoustic wave resonator, wherein the frequency is, for example, the resonant frequency, close to 0.

The temperature coefficient of the acoustic wave of niobium oxide, tantalum oxide, tungsten oxide, or tellurium oxide is negative. Thus, the provision of the additional film 17 made of niobium oxide, tantalum oxide, tungsten oxide, or tellurium oxide on the silicon oxide film 14 deteriorates the temperature coefficient of frequency of the surface acoustic wave resonator.

FOURTH COMPARATIVE EXAMPLE

Figures 10A, 10B:
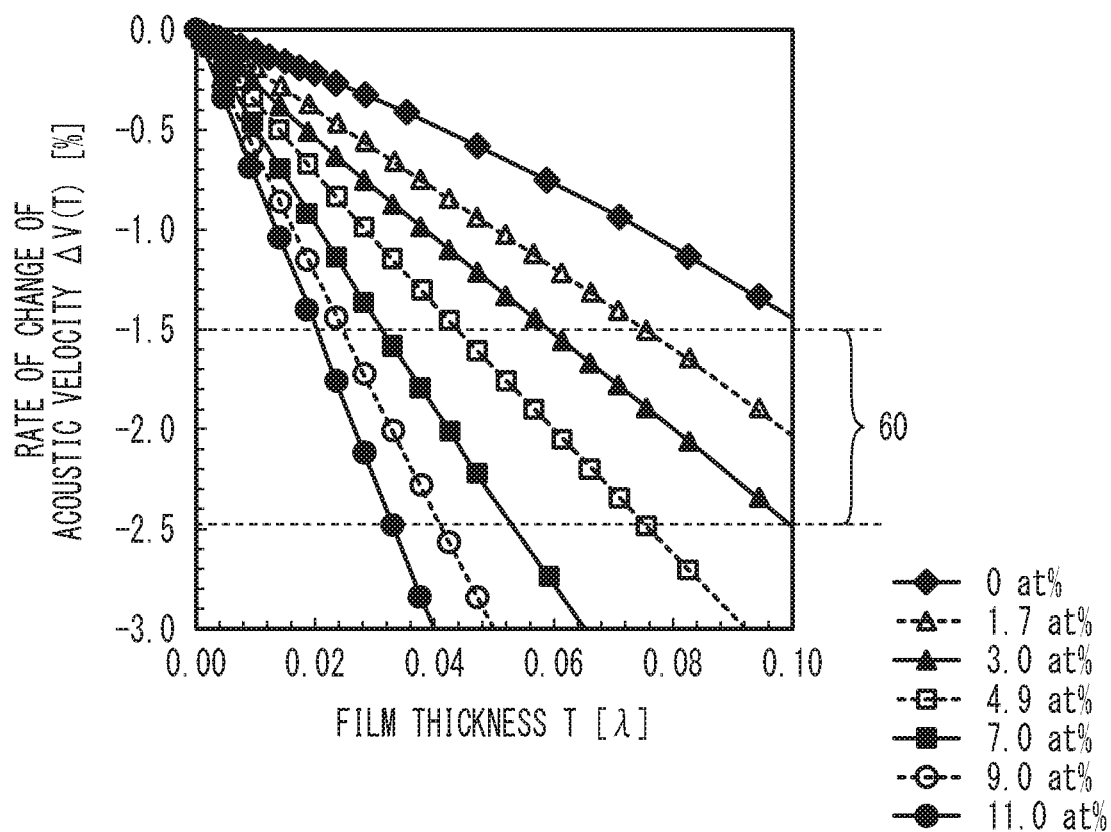
FIG. 10A presents acoustic velocity in the bulk with respect to the fluorine concentration in the additional film of a fourth comparative example.
FIG. 10B is a graph of a rate of change of the acoustic velocity versus the film thickness of the additional film in the fourth comparative example.

A fourth comparative example has the same structure as the first comparative example except that the additional film 17 is a silicon oxide film to which fluorine (F) is added. FIG. 10A presents acoustic velocities in the bulk with respect to the fluorine concentration in the additional film of the fourth comparative example, and FIG. 10B illustrates the rate of change of the acoustic velocity with respect to the film thickness of the additional film in the fourth comparative example normalized by λ. As presented in FIG. 10A, as the fluorine concentration in silicon oxide ($SiO_2$) increases, the acoustic velocity in the bulk decreases.

As illustrated in FIG. 10B, as the fluorine concentration in silicon oxide increases, the rate of change of the acoustic velocity ΔV(T) greatly changes with respect to the film thickness T. For example, when the fluorine concentration is 4.9 atomic %, the rate of change of the acoustic velocity ΔV(T) becomes within the range 60 with the film thickness T that is one-half of the film thickness of the silicon oxide film without fluorine. When the fluorine concentration is 11 atomic %, the rate of change of the acoustic velocity ΔV(T) becomes within the range 60 with the film thickness T from 0.019λ (80 nm) to 0.033λ (130 nm).

FIFTH COMPARATIVE EXAMPLE

A surface acoustic wave resonator in accordance with a fifth comparative example was fabricated to examine the temperature coefficient of frequency of a silicon oxide film to which fluorine is added. The fifth comparative example has the same structure as the structure illustrated in FIG. 7. The fabrication conditions are as follows.

Piezoelectric substrate 10: 127.86° rotated Y-cut X-propagation lithium niobate substrate Metal film 12: Ru film with a film thickness of 10 nm, a copper film with a film thickness of 131 nm (0.0655λ), and a Cr film with a film thickness of 9 nm stacked in this order from the piezoelectric substrate side Silicon oxide film 14: Silicon oxide film having a film thickness on the metal film 12 of 450 nm (0.225λ) wherein the concentration of fluorine in which was varied Additional film 17: Niobium oxide with a film thickness of 0.0035λ.

IDT 22: The pitch λ is 2.0 μm, the number of pairs is 100 pairs, and the aperture length is 20λ.

FIG. 11 presents the characteristics of the acoustic wave resonator in accordance with the fifth comparative example. The resonant frequency represents the resonant frequency of the surface acoustic wave resonator, the SAW acoustic velocity represents the acoustic velocity of the surface acoustic wave, and the TCF(fr) represents the temperature coefficient of frequency of the resonant frequency. As presented in FIG. 11, as the fluorine concentration is increased, the resonant frequency becomes lower, and the acoustic velocity of the surface acoustic wave becomes less. When the fluorine concentration is between 3 atomic % and 4.9 atomic %, the TCF(fr) is 0.

First Variation of the First Embodiment

Figure 12:
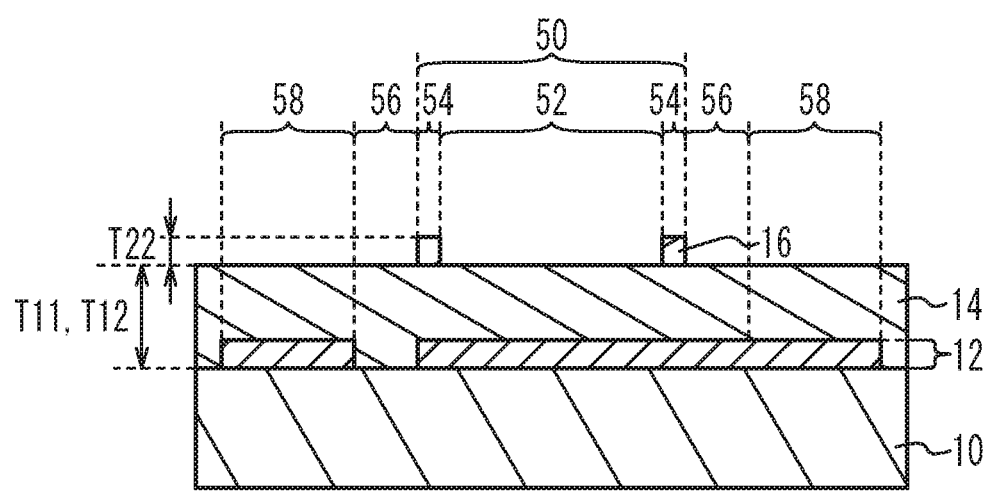
FIG. 12 is a cross-sectional view of an acoustic wave resonator in accordance with a first variation of the first embodiment.

FIG. 12 is a cross-sectional view of an acoustic wave resonator in accordance with a first variation of the first embodiment. As illustrated in FIG. 12, the silicon oxide film 16 is located on the silicon oxide film 14 in the edge regions 54. The film thickness of the silicon oxide film 16 in the edge region 54 is T22. In the center region 52, the gap regions 56, and the bus bar regions 58, no silicon oxide film 16 is provided. The film thickness T11 of the silicon oxide film 14 in the edge region 54 is approximately equal to the film thickness T12 of the silicon oxide film 14 in the center region 52. Accordingly, the upper surface of the silicon oxide film 14 is flat. Other structures are the same as those of the first embodiment, and the description thereof is thus omitted.

The fluorine concentration in the silicon oxide film 16 is higher than that in the silicon oxide film 14. Thus, the acoustic velocity in the edge region 54 is less than the acoustic velocity in the center region 52. Accordingly, the piston mode is achieved, and lateral-mode spurious is thus reduced. The acoustic velocity in the bulk of the silicon oxide film 16 is less than the acoustic velocity in the bulk of the silicon oxide film 14. Thus, the film thickness of the silicon oxide film 16 is able to be thinner than that in the second comparative example. Therefore, the silicon oxide film 16 is easily processed. Furthermore, the unevenness of the upper surfaces, exposed to the air, of the silicon oxide films 14 and 16 is smaller than that in the second comparative example. Thus, unnecessary response due to the unevenness on the upper surface is reduced. Additionally, the temperature coefficient of frequency of the fluorine-added silicon oxide film 16 is opposite in sign to that of the piezoelectric substrate 10. Thus, the deterioration of the frequency temperature characteristic described in the third comparative example is reduced.

Second Variation of the First Embodiment

Figure 13A:
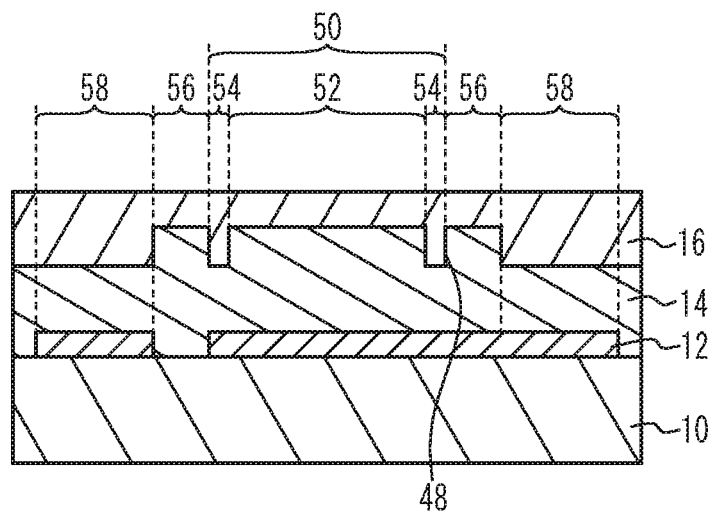
FIG. 13A through FIG. 13C are cross-sectional views of acoustic wave resonators in accordance with second through fourth variations of the first embodiment, respectively.

FIG. 13A is a cross-sectional view of an acoustic wave resonator in accordance with a second variation of the first embodiment. As illustrated in FIG. 13A, the film thickness of the silicon oxide film 16 in the bus bar region 58 may be greater than the film thickness of the silicon oxide film 16 in the center region 52 as well as the film thickness of the silicon oxide film 16 in the edge region 54. Other structures are the same as those in the first embodiment, and the description thereof is thus omitted.

Third Variation of the First Embodiment

Figure 13B:
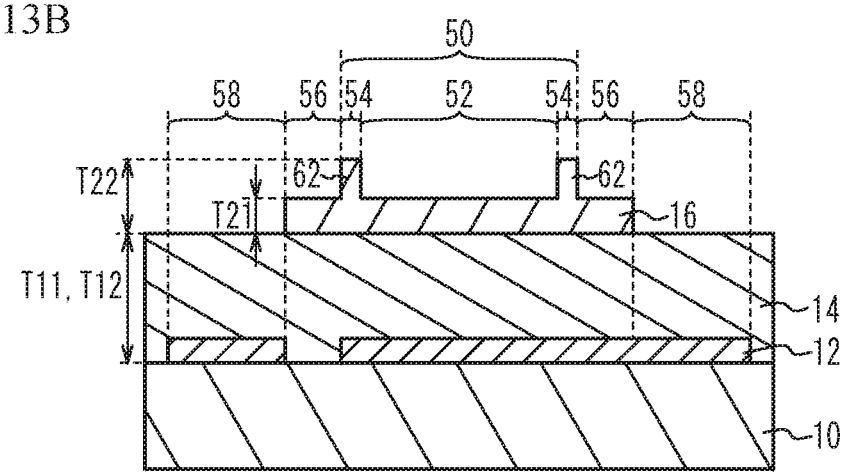

FIG. 13B is a cross-sectional view of an acoustic wave resonator in accordance with a third variation of the first embodiment. As illustrated in FIG. 13B, the film thickness T12 of the silicon oxide film 14 in the edge region 54 is approximately equal to the film thickness T11 of the silicon oxide film 14 in the center region 52, and the upper surface of the silicon oxide film 14 is flat. The silicon oxide film 16 of which the film thickness T22 in the edge region 54 is greater than the film thickness T21 in the center region 52 is located on the silicon oxide film 14. Accordingly, protruding portions 62 are formed on the upper surface of the silicon oxide film 16 in the edge regions 54. In the third variation of the first embodiment, no silicon oxide film 16 is located in the bus bar regions 58, but the silicon oxide film 16 having a thickness equal to those in the center region 52 and the gap regions 56 may be provided. Other structures are the same as those of the first embodiment, and the description thereof is thus omitted.

Fourth Variation of the First Embodiment

Figure 13C:
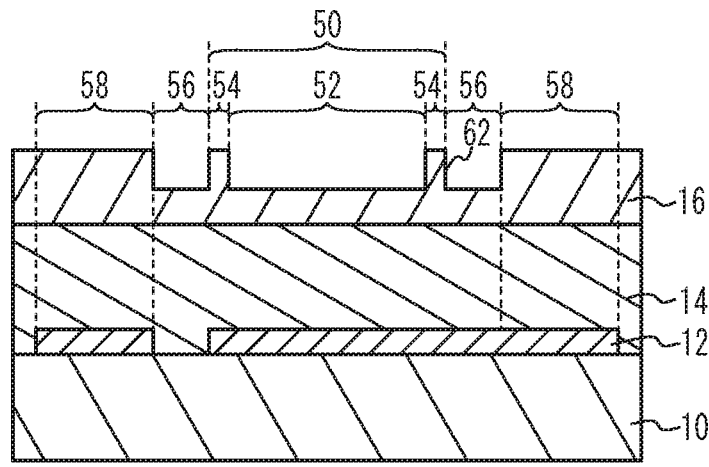

FIG. 13C is a cross-sectional view of an acoustic wave resonator in accordance with a fourth variation of the first embodiment. As illustrated in FIG. 13C, the silicon oxide film 16 of which the film thickness is equal to the film thickness in the center region 52 is located in the gap regions 56, and the silicon oxide film 16 of which the film thickness is equal to the film thickness in the edge region 54 is located in the bus bar regions 58. Other structures are the same as those of the third variation of the first embodiment, and the description thereof is thus omitted.

Fifth Variation of the First Embodiment

Figure 14A:
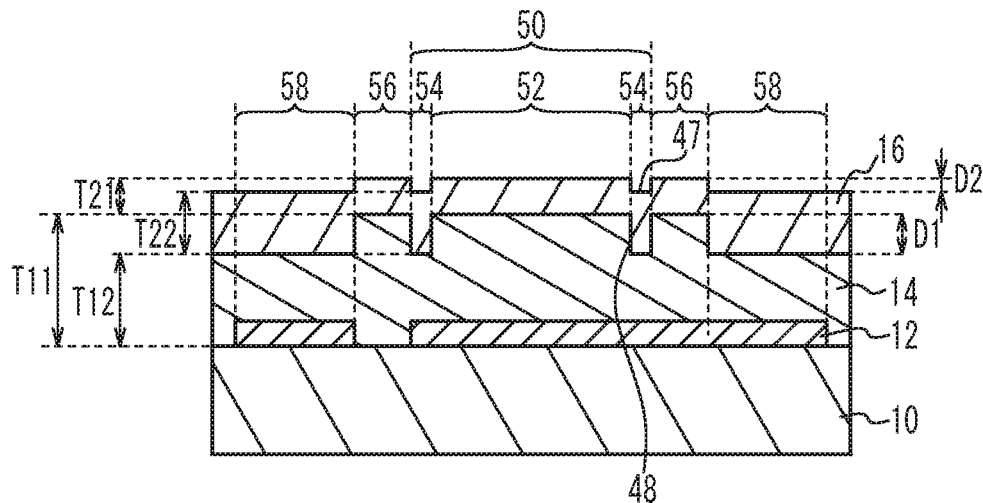
FIG. 14A through FIG. 14C are cross-sectional views of acoustic wave resonators in accordance with fifth through seventh variations of the first embodiment, respectively.

FIG. 14A is a cross-sectional view of an acoustic wave resonator in accordance with a fifth variation of the first embodiment. As illustrated in FIG. 14A, the film thickness T12 of the silicon oxide film 14 in the edge regions 54 is less than the film thickness T11 of the silicon oxide film 14 in the center region 52. Accordingly, the recessed portions 48 are formed on the upper surface of the silicon oxide film 14 in the edge regions 54. The depth D2 of a recessed portion 47 on the upper surface of the silicon oxide film 16 is less than the depth D1 of the recessed portion 48 on the upper surface of the silicon oxide film 14. Accordingly, the film thickness T22 of the silicon oxide film 16 in the edge region 54 is greater than the film thickness T21 of the silicon oxide film 16 in the center region 52. Other structures are the same as those of the second variation of the first embodiment, and the description thereof is thus omitted.

Sixth Variation of the First Embodiment

Figure 14B:
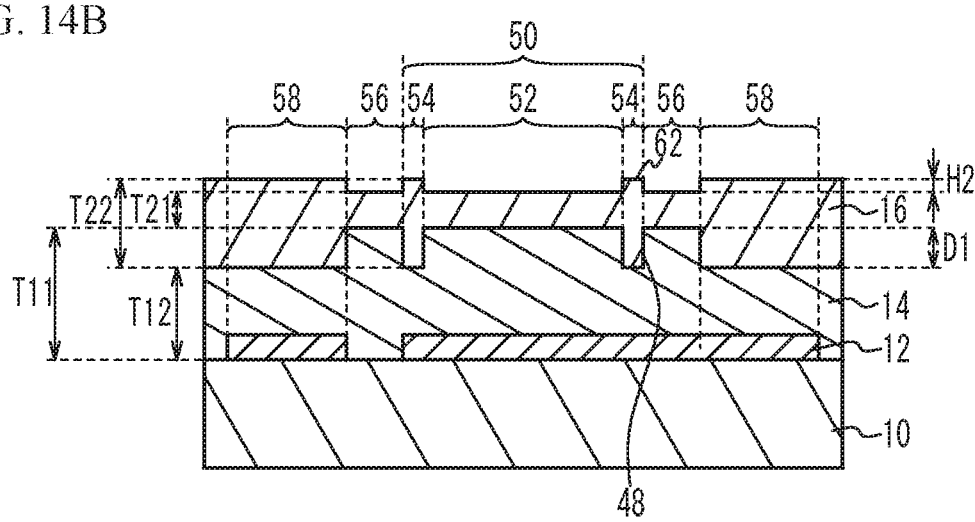

FIG. 14B is a cross-sectional view of an acoustic wave resonator in accordance with a sixth variation of the first embodiment. As illustrated in FIG. 14B, the film thickness T12 of the silicon oxide film 14 in the edge region 54 is less than the film thickness T11 of the silicon oxide film 14 in the center region 52, and the recessed portions 48 are formed on the upper surface of the silicon oxide film 14 in the edge regions 54. The protruding portions 62 are formed on the upper surface of the silicon oxide film 16 in the edge regions 54. The film thickness T22 of the silicon oxide film 16 in the edge region 54 is greater than the film thickness T21 of the silicon oxide film 16 in the center region 52. The height H2 of the protruding portion 62 on the upper surface of the silicon oxide film 16 is less than the depth D1 of the recessed portion 48 on the upper surface of the silicon oxide film 14. Accordingly, the unevenness of the upper surface of the silicon oxide film 16 is less than the unevenness of the upper surface of the silicon oxide film 14. Other structures are the same as those of the second variation of the first embodiment, and the description thereof is thus omitted.

Seventh Variation of the First Embodiment

Figure 14C:
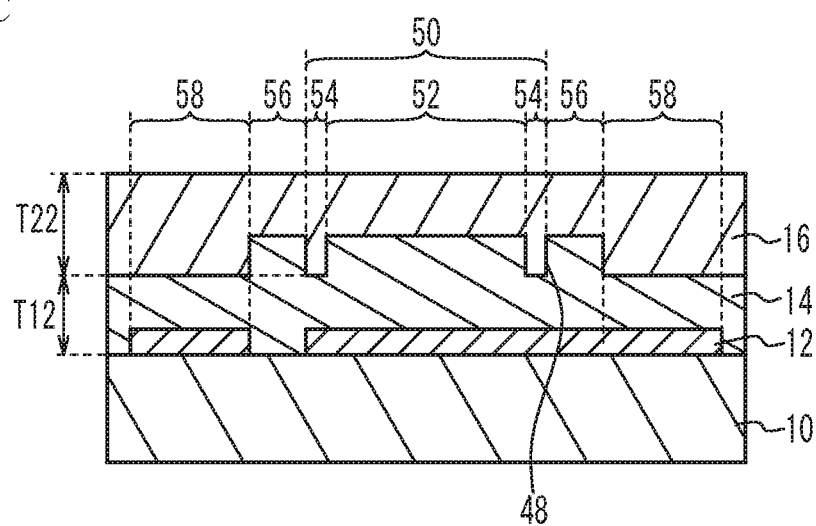

FIG. 14C is a cross-sectional view of an acoustic wave resonator in accordance with a seventh variation of the first embodiment. As illustrated in FIG. 14C, the film thickness T22 of the silicon oxide film 16 in the edge region 54 is greater than the film thickness T12 of the silicon oxide film 14. Other structures are the same as those of the second variation of the first embodiment, and the description thereof is thus omitted.

Eighth Variation of the First Embodiment

Figure 15A:
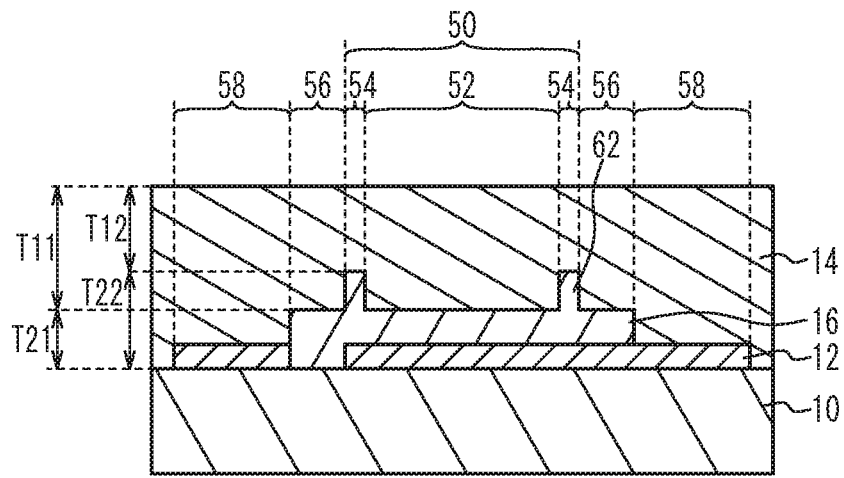
FIG. 15A through FIG. 15C are cross-sectional views of acoustic wave resonators in accordance with eighth through tenth variations of the first embodiment.

FIG. 15A is a cross-sectional view of an acoustic wave resonator in accordance with an eighth variation of the first embodiment. As illustrated in FIG. 15A, the silicon oxide film 16 is located on the metal film 12, and the silicon oxide film 14 is located on the silicon oxide film 16. The protruding portions 62 are located on the upper surface of the silicon oxide film 16 in the edge regions 54. Accordingly, the film thickness T22 of the silicon oxide film 16 in the edge region 54 is greater than the film thickness T21 of the silicon oxide film 16 in the center region 52. The film thickness T11+T21 is approximately equal to the film thickness T12+T22. Thus, the upper surface of the silicon oxide film 14 is substantially flat. Other structures are the same as those of the third variation of the first embodiment, and the description thereof is thus omitted.

Ninth Variation of the First Embodiment

Figure 15B:
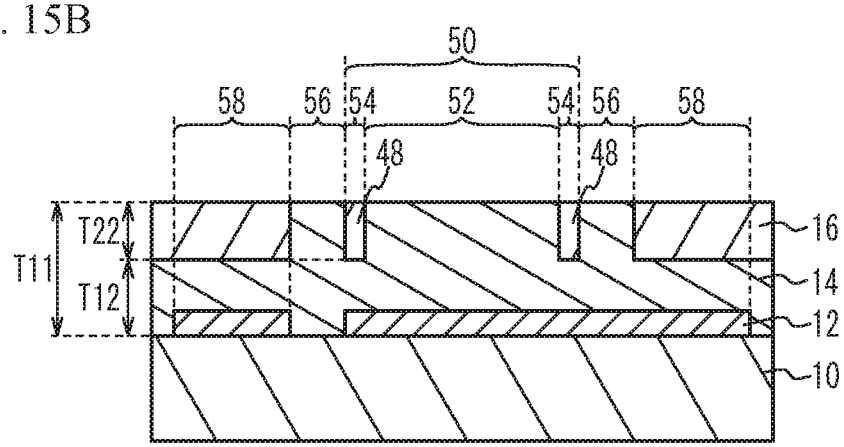

FIG. 15B is a cross-sectional view of an acoustic wave resonator in accordance with a ninth variation of the first embodiment. As illustrated in FIG. 15B, no silicon oxide film 16 is located in the center region 52 and the gap regions 56. The silicon oxide film 16 may not be necessarily located in other than the edge regions 54. The film thickness T12+T22 is approximately equal to the film thickness T11. Thus, the upper surface of the silicon oxide films 14 and 16 is substantially flat. Other structures are the same as those of the second variation of the first embodiment, and the description thereof is thus omitted.

Tenth Variation of the First Embodiment

Figure 15C:
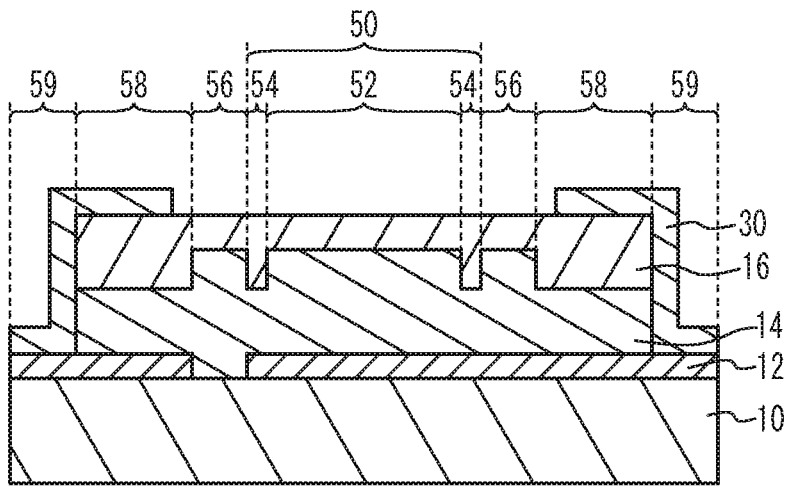

FIG. 15C is a cross-sectional view of an acoustic wave resonator in accordance with a tenth variation of the first embodiment. As illustrated in FIG. 15C, apertures penetrating through the silicon oxide films 14 and 16 are provided in the pad regions 59. In the pad region 59, the pad electrode 30 that is in contact with the metal film 12 is located on the silicon oxide film 16 in the bus bar region 58. Other structures are the same as those of the second variation of the first embodiment, and the description thereof is thus omitted.

Eleventh Variation of the First Embodiment

Figure 16A:
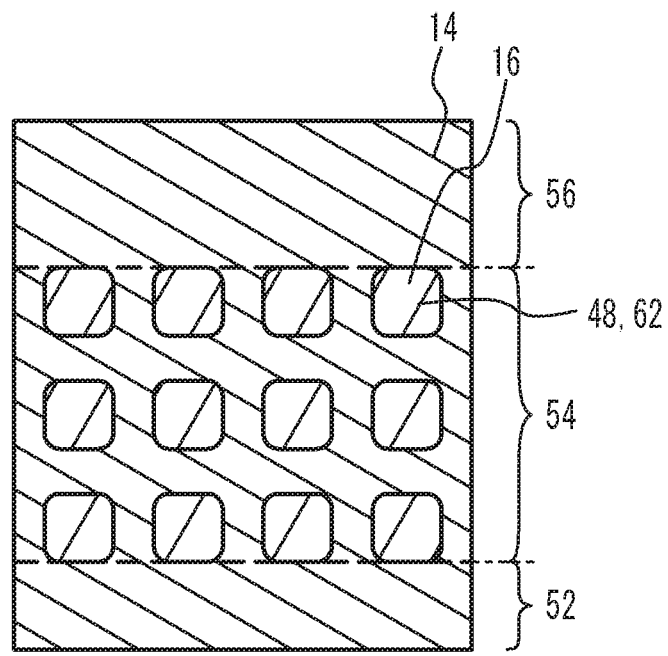
FIG. 16A and FIG. 16B are enlarged plan views of acoustic wave resonators in accordance with an eleventh variation of the first embodiment.
Figure 16B:
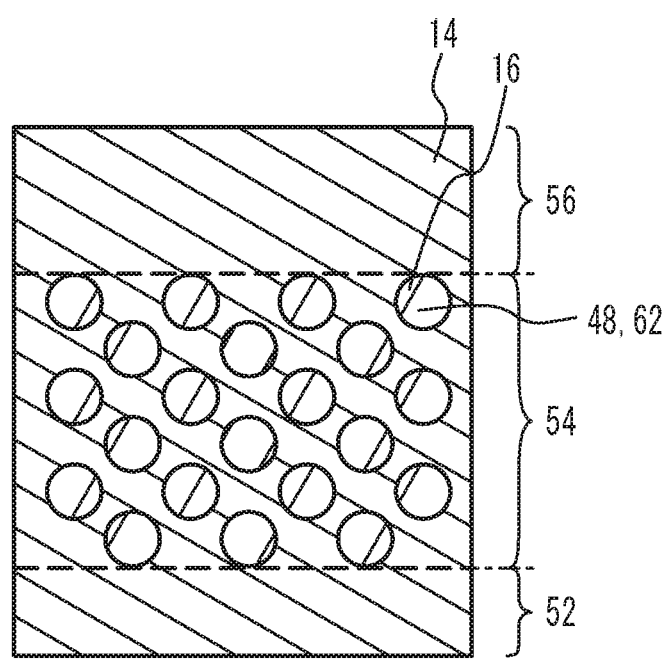

FIG. 16A and FIG. 16B are enlarged plan views near the edge region 54 of an acoustic wave resonator in accordance with an eleventh variation of the first embodiment. As illustrated in FIG. 16A and FIG. 16B, the recessed portions 48 on the upper surface of the silicon oxide film 14 in the edge region 54 and the protruding portions 62 on the upper surface of the silicon oxide film 16 in the edge region 54 are arranged in a part of the edge region 54 to form an island pattern. That is, the region where the film thickness of the silicon oxide film 16 is greater than that in the center region 52 (or the region where an element is displaced) may be a part of the edge region 54. Although not illustrated, the recessed portions 48 on the upper surface of the silicon oxide film 14 in the edge regions 54 or the protruding portions 62 on the upper surface of the silicon oxide film 16 in the edge regions 54 may be periodically arranged between the electrode fingers 26 or on the electrode fingers 26. Other structures are the same as those of the first embodiment and the first through tenth variations thereof, and the description thereof is thus omitted.

In the first embodiment and the variations thereof, the silicon oxide films 14 and 16 are located on the electrode fingers 26 in the overlap region 50. In the silicon oxide film 14 (a first silicon oxide film), the film thickness T12 in the edge region 54 is equal to or less than the film thickness T11 in the center region 52. In the silicon oxide film 16 (a second silicon oxide film), the film thickness T22 in the edge region 54 is greater than the film thickness T21 in the center region 52. The silicon oxide film 16 contains an element or molecule that slows the acoustic velocity, and has a concentration of the element or molecule greater than that in the silicon oxide film 14.

Accordingly, the acoustic velocity of the surface acoustic wave in the edge region 54 is less than that in the center region 52. Accordingly, the piston mode is achieved, and lateral-mode spurious is thereby reduced. The film thickness T12 is equal to or less than the film thickness T11 (that is, the film thicknesses T12 and T11 are approximately the same, or the film thickness T12 is less than the film thickness T11), and the film thickness T22 is greater than the film thickness T21. Accordingly, compared to a case where the concentration of the element or molecule is the same between the silicon oxide films 14 and 16, the unevenness of the upper surfaces of the silicon oxide films 14 and 16 is reduced. Thus, unnecessary response due to the unevenness is reduced. Furthermore, since the silicon oxide film 16 is based on a silicon oxide film, the temperature coefficient of frequency of the silicon oxide film 16 is opposite in sign to that of the piezoelectric substrate 10. Thus, compared to a case where the additional film 17 having a temperature coefficient of frequency with the same sign as that of the piezoelectric substrate as in the second comparative example, the deterioration of the frequency temperature characteristic is reduced.

The film thickness T12 is preferably equal to or less than 0.9 times the film thickness T11, more preferably equal to or less than 0.8 times the film thickness T11. The film thickness T22 is preferably equal to or greater than 1.1 times the film thickness T21, more preferably equal to or greater than 1.2 times the film thickness T21. As described in the eleventh variation of the first embodiment, it is sufficient if the film thickness T12 of the silicon oxide film 14 in at least a part of the edge region 54 is equal to or less than the film thickness T11 of the silicon oxide film 14 in the center region 52. It is sufficient if the film thickness T22 of the silicon oxide film 16 in at least a part of the edge region 54 is greater than the film thickness T21 of the silicon oxide film 16 in the center region 52.

The difference between the film thicknesses T21 and T22 can be set so that lateral-mode spurious is reduced at the operation frequency by the density, the Young's modulus and/or the acoustic velocity of the lateral-wave in the bulk of the silicon oxide film 16. For example, as illustrated in FIG. 9A and FIG. 9B, the density, the Young's modulus and/or the acoustic velocity can be changed by varying the fluorine concentration. For example, when fluorine or the like is not added to the silicon oxide film 14 and the fluorine concentration in the silicon oxide film 16 is set as 3 atomic %, the difference between the film thicknesses T22 and T21 is preferably 2% or greater in the film thickness normalized by the pitch λ. When the fluorine concentration in the silicon oxide film 16 is set as 4.9 atomic %, the difference between the film thicknesses T22 and T21 is preferably 0.8% or greater in the film thickness normalized by the pitch λ. As described above, the difference between the film thicknesses T21 and T22 is preferably 0.5% or greater, more preferably 1% or greater in the film thickness normalized by the pitch λ. The difference between the film thicknesses T21 and T22 is preferably 10% or less, more preferably 5% or less in the film thickness normalized by the pitch λ.

To achieve the piston mode, the width of the edge region 54 in the Y direction is preferably 5λ or less (for example, equal to or less than one-quarter of the aperture length), more preferably 2λ or less (for example, equal to or less than one-tenth of the aperture length). The width of the edge region 54 in the Y direction is preferably 0.1λ or greater (for example, equal to or greater than one two-hundredth of the aperture length), more preferably 0.5λ or greater (for example, equal to or greater than one-fortieth of the aperture length). Each of the silicon oxide films 14 and 16 has a film thicknesses of, for example, 0.02λ (100 nm) to 0.5λ (2000 nm).

As illustrated in FIG. 4C, by simultaneously uniformly etching the upper surface of the silicon oxide film 16 in the edge region 54 and the center region 52 while keeping the difference between the film thicknesses T22 and T21, the frequency such as the resonant frequency is able to be adjusted while lateral-mode spurious is reduced.

When a boundary face exists in each of the silicon oxide films 14 and 16, acoustic loss increases. Thus, each of the silicon oxide films 14 and 16 is preferably formed as a single film having no boundary face. This structure makes the acoustic wave resonator have low-loss.

The element or molecule that slows the acoustic velocity is at least one of fluorine, hydrogen (H), $CH_3$, $CH_2$, chlorine (Cl), carbon (C), nitrogen (N), phosphorus (P), boron (B), and sulfur (S). These elements and molecules substitute oxygen in the Si—O bond in the silicon oxide film 16. Accordingly, the network of Si—O in the silicon oxide film 16 is cut. Thus, the addition of these elements or molecules reduces the Young's modulus of the silicon oxide film and slows the acoustic velocity in the bulk. Furthermore, the absolute value of the temperature coefficient of frequency increases.

The silicon oxide film 14 may not necessarily substantially contain the element or molecule to the extent that the element or molecule is not intentionally added. This makes the difference in acoustic velocity between the silicon oxide films 14 and 16 large. Thus, the difference between the film thicknesses T22 and T11 can be reduced. Thus, the processing of the silicon oxide film 14 and/or 16 becomes easier. The silicon oxide film 14 may intentionally contain the element or molecule. This configuration further improves the temperature coefficient of frequency. Since the total film thickness of the silicon oxide films 14 and 16 can be reduced, the loss of the acoustic wave can be reduced.

To slow the acoustic velocity in the edge region 54, the concentration of the element or molecule added to the silicon oxide film 16 is preferably 0.1 atomic % or greater, more preferably 1% or greater, further preferably 2% or greater. Too high concentration of the element or molecule prevents the element or molecule from substituting oxygen. Thus, the concentration of the element or molecule is preferably 20 atomic % or less, more preferably 12 atomic % or less, further preferably 10 atomic % or less. To make the acoustic velocity in the edge region 54 less than that in the center region 52, the difference in concentration of the element or molecule between the silicon oxide films 16 and 14 is preferably 0.1 atomic % or greater, more preferably 1 atomic % or greater, further preferably 2% atom % or greater.

In the boundary face between the silicon oxide films 14 and 16, the concentration of the element or molecule may consecutively vary. In the boundary face between the silicon oxide films 14 and 16, the concentration of the element or molecule may vary in stages.

In the first embodiment and the second and seventh through tenth variations thereof, the upper surface of the silicon oxide film that is at least one of the silicon oxide films 14 and 16 that is exposed to the air is substantially flat to the extent of manufacturing error (to the extent of planarization by CMP, for example). That is, the unevenness associated with the recessed portion 48 and the protruding portion 62 is not formed on the upper surface of the silicon oxide film exposed to the air. Thus, unnecessary waves due to the unevenness of the upper surface are reduced. Even without planarization in FIG. 3C, unnecessary waves due to the unevenness of the upper surface is almost reduced by the planarization in FIG. 4B.

As in the first and third through sixth variations of the first embodiment, the upper surface of the silicon oxide film 16 may not be necessarily planarized. In the first, third, and fourth variations of the first embodiment, the level of the unevenness of the upper surface of the silicon oxide film 16 substantially corresponds to the difference between the film thicknesses T21 and T22 of the silicon oxide film 16. In the fifth and sixth variations of the first embodiment, the level of the unevenness of the upper surface of the silicon oxide film 16 is less than the difference between the film thicknesses T21 and T22 of the silicon oxide film 16. Thanks to this structure, unnecessary waves due to the unevenness on the upper surface is reduced compared to the first, third, and fourth variations of the first embodiment.

As in the first embodiment and the first through sixth and eighth through tenth variations thereof, the film thickness T11 of the silicon oxide film 14 in the center region 52 may be greater than the film thickness T21 of the silicon oxide film 16 in the center region 52, and/or the film thickness T12 of the silicon oxide film 14 in the edge region 54 may be greater than the film thickness T22 of the silicon oxide film 16 in the edge region 54.

As in the first embodiment and the second, fourth through seventh, ninth, and tenth variations thereof, the silicon oxide film 16 is located in at least a part of the bus bar region 58 where the bus bar 28 is provided. This structure slows the acoustic velocity in the bus bar region 58. Thus, the energy of unnecessary waves in a high-order lateral mode concentrates in the bus bar region 58. Since the confinement of unnecessary waves in the high-order lateral mode in the gap region 56 is reduced, lateral-mode spurious is reduced.

As in the second, fourth through seventh, ninth, and tenth variations of the first embodiment, the film thickness of the silicon oxide film 16 in the bus bar region 58 is preferably greater than the film thickness T21 of the silicon oxide film 16 in the center region 52. This configuration further slows the acoustic velocity in the bus bar region 58, and thus lateral-mode spurious is further reduced. The silicon oxide film 16 in the bus bar region 58 may be located across the entire of the bus bar region 58 in the Y direction, but may be located in a part of the bus bar region 58 (for example, a part closer to the gap region 56).

As in the tenth variation of the first embodiment, a metal film such as the pad electrode 30 may be located on the silicon oxide film 14 and/or 16 in at least a part of the bus bar region 58. The metal film may be a part of a wiring line interconnecting, for example, the pad electrodes 30 or the acoustic wave resonators. This structure further slows the acoustic velocity on the bus bar region 58, and thereby, further reduces lateral-mode spurious.

As in the seventh variation of the first embodiment, in the edge region 54, the film thickness T22 of the silicon oxide film 16 is greater than the film thickness T12 of the silicon oxide film 14. This structure further improves the frequency temperature characteristic. In addition, since the total film thickness of the silicon oxide films 14 and 16 is reduced, the loss of the acoustic wave is reduced.

As in the first embodiment and the first through seventh, ninth, and tenth variations thereof, the silicon oxide film 14 may be located between the piezoelectric substrate 10 and the silicon oxide film 16. As in the eighth variation of the first embodiment, the silicon oxide film 16 may be located between the piezoelectric substrate 10 and the silicon oxide film 14.

As in the first embodiment and the second through eighth and tenth variations thereof, the silicon oxide film 16 may be located in the center region 52. As in the first and ninth variations of the first embodiment, no silicon oxide film 16 may be located in the center region 52.

As in the first embodiment and the variations thereof, the silicon oxide films 14 and 16 are preferably in contact with each other. Another insulating film may be located between the silicon oxide films 14 and 16 to the extent that the advantage of the first embodiment is achieved. Another insulating film may be located between the silicon oxide film 14 and/or 16 and the air.

Second Embodiment

A second embodiment and variations thereof provide a silicon oxide film 18 in addition to the silicon oxide films 14 and 16. The concentration of the element or molecule added to the silicon oxide film 18 is less than that in the silicon oxide film 16 and is equal to or greater than that in the silicon oxide film 14.

Figure 17A:
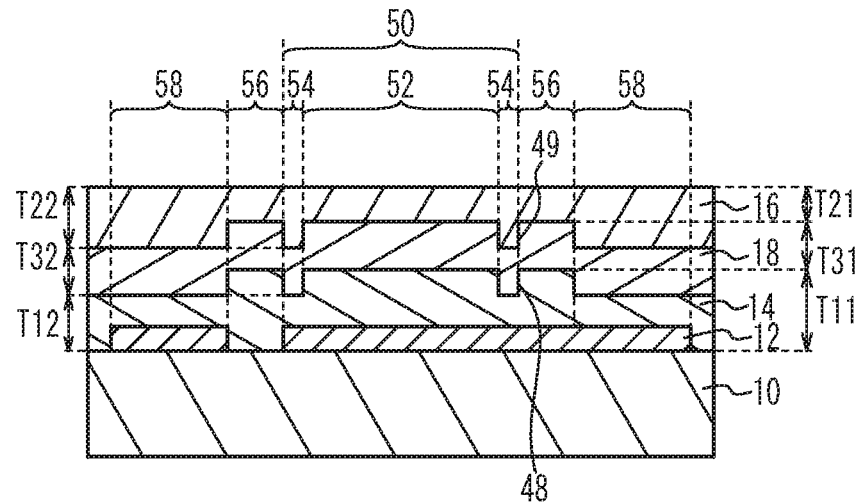
FIG. 17A through FIG. 17C are cross-sectional views of acoustic wave resonators in accordance with a second embodiment and first and second variations thereof, respectively.

FIG. 17A is a cross-sectional view of an acoustic wave resonator in accordance with the second embodiment. As illustrated in FIG. 17A, the silicon oxide film 18 is located between the silicon oxide films 14 and 16. The film thickness T32 of the silicon oxide film 18 in the edge region 54 is approximately equal to the film thickness T31 of the silicon oxide film 18 in the center region 52. In the second embodiment, after unevenness is formed on the upper surface of the silicon oxide film 14, the silicon oxide films 18 and 16 are formed, and the upper surface of the silicon oxide film 16 is then planarized. Other structures are the same as those of the second variation of the first embodiment, and the description thereof is thus omitted.

First Variation of the Second Embodiment

Figure 17B:
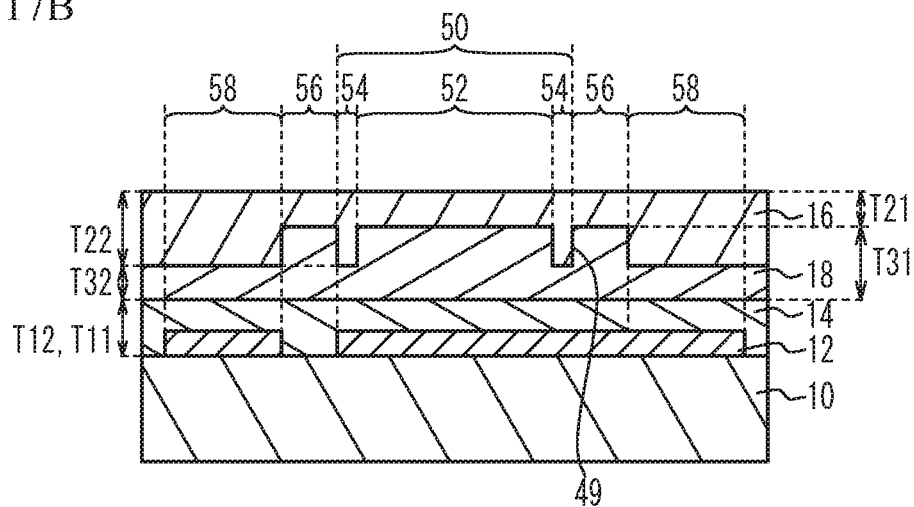

FIG. 17B is a cross-sectional view of an acoustic wave resonator in accordance with a first variation of the second embodiment. As illustrated in FIG. 17B, the film thickness T12 of the silicon oxide film 14 in the edge region 54 is approximately equal to the film thickness T11 of the silicon oxide film 14 in the center region 52. The film thickness T32 of the silicon oxide film 18 in the edge region 54 is less than the film thickness T31 of the silicon oxide film 18 in the center region 52. This structure forms recessed portions 49 on the upper surface of the silicon oxide film 18 in the edge regions 54. The film thickness T22 of the silicon oxide film 16 in the edge region 54 is greater than the film thickness T21 of the silicon oxide film 16 in the center region 52. The upper surface of the silicon oxide film 16 is substantially flat. That is, the film thickness T12+T22+T32 in the edge region 54 is approximately equal to the film thickness T11+T21+T31 in the center region 52. In the first variation of the second embodiment, after unevenness is formed on the upper surface of the silicon oxide film 18, the silicon oxide film 16 is formed, and the upper surface of the silicon oxide film 16 is then planarized. Other structures are the same as those of the second embodiment, and the description thereof is thus omitted.

Second Variation of the Second Embodiment

Figure 17C:
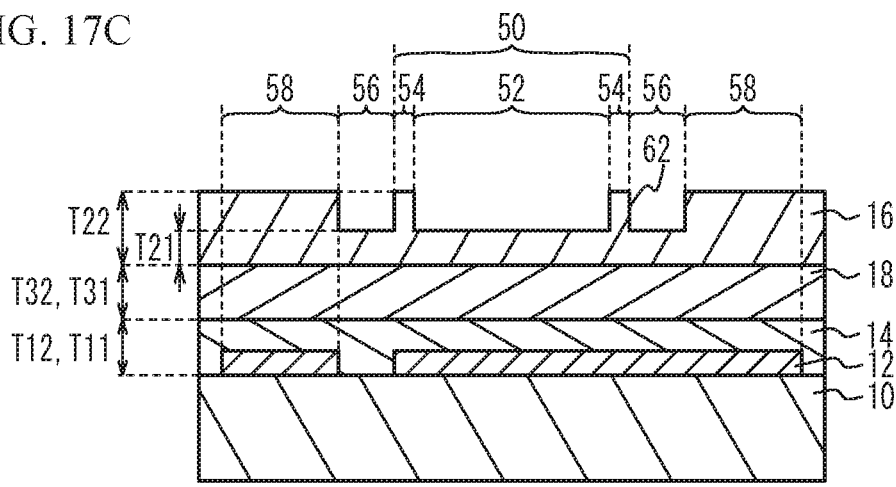

FIG. 17C is a cross-sectional view of an acoustic wave resonator in accordance with a second variation of the second embodiment. As illustrated in FIG. 17C, the film thickness T12 of the silicon oxide film 14 in the edge region 54 is approximately equal to the film thickness T11 of the silicon oxide film 14 in the center region 52. The film thickness T32 of the silicon oxide film 18 in the edge region 54 is approximately equal to the film thickness T31 of the silicon oxide film 18 in the center region 52. The film thickness T22 of the silicon oxide film 16 in the edge region 54 is greater than the film thickness T21 of the silicon oxide film 16 in the center region 52. This structure forms protruding portions 62 on the upper surface of the silicon oxide film 16 in the edge region 54. In the second variation of the second embodiment, after the silicon oxide films 14 and 16 are formed, unevenness is formed on the upper surface of the silicon oxide film 16. Since the planarization is not performed, the number of fabrication steps is reduced. Other structures are the same as those of the second embodiment, and the description thereof is thus omitted.

Third Variation of the Second Embodiment

Figure 18A:
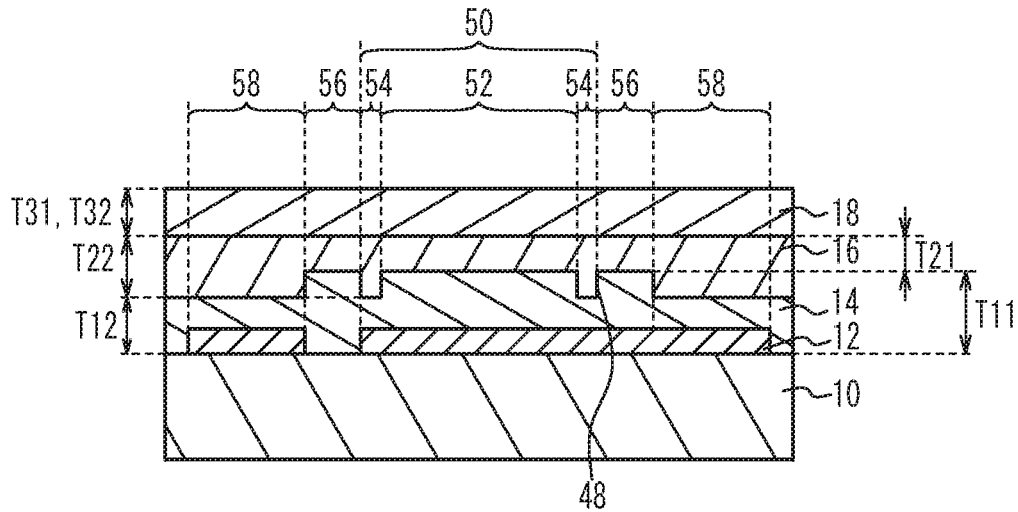
FIG. 18A through FIG. 18C are cross-sectional views of acoustic wave resonators in accordance with third through fifth variations of the second embodiment, respectively.

FIG. 18A is a cross-sectional view of an acoustic wave resonator in accordance with a third variation of the second embodiment. As illustrated in FIG. 18A, the silicon oxide film 18 is formed on the silicon oxide films 14 and 16. The film thickness T32 of the silicon oxide film 18 in the edge region 54 is approximately equal to the film thickness T31 of the silicon oxide film 18 in the center region 52. In the third variation of the second embodiment, after unevenness is formed on the upper surface of the silicon oxide film 14, the silicon oxide film 16 is formed, and the upper surface of the silicon oxide film 16 is then planarized. The silicon oxide film 18 is then formed. Other structures are the same as those of the second variation of the first embodiment, and the description thereof is thus omitted.

Fourth Variation of the Second Embodiment

Figure 18B:
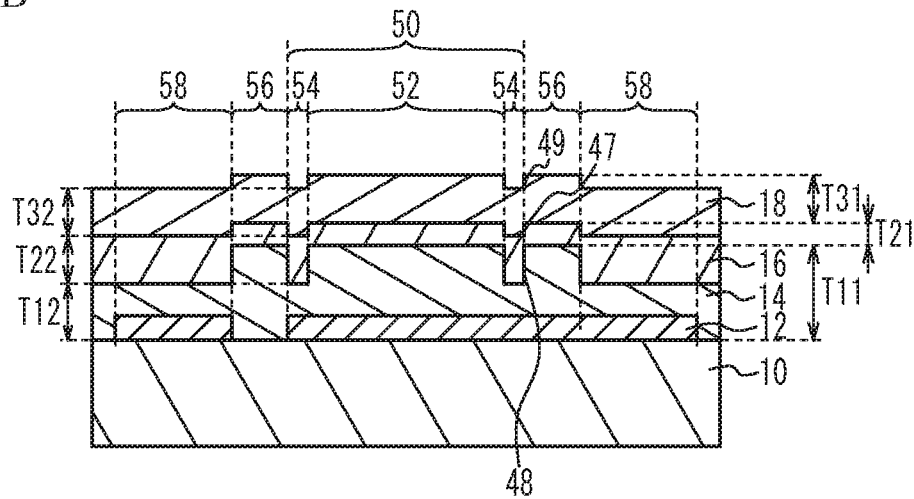

FIG. 18B is a cross-sectional view of an acoustic wave resonator in accordance with a fourth variation of the second embodiment. As illustrated in FIG. 18B, the film thickness T32 of the silicon oxide film 18 in the edge region 54 is approximately equal to the film thickness T31 of the silicon oxide film 18 in the center region 52. The recessed portions 49 are formed on the upper surface of the silicon oxide film 18 in the edge regions 54. Other structures are the same as those of the fifth variation of the first embodiment, and the description thereof is thus omitted.

Fifth Variation of the Second Embodiment

Figure 18C:
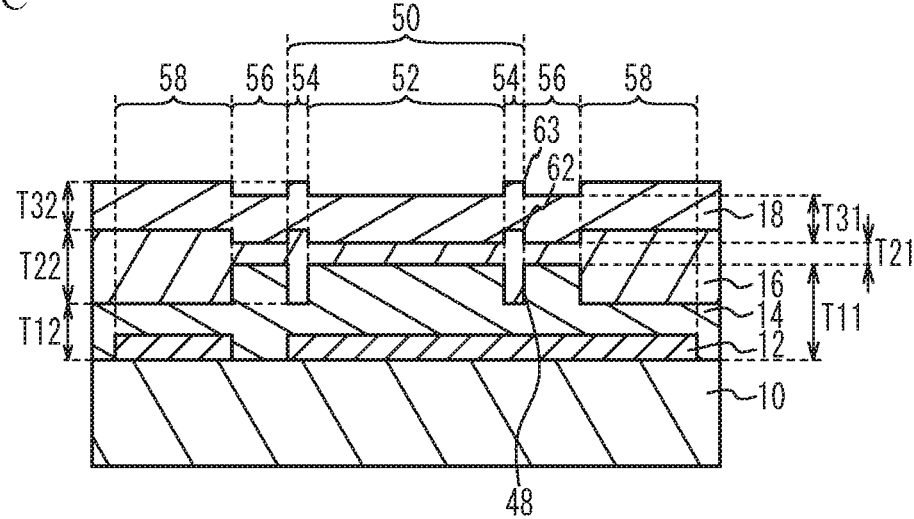

FIG. 18C is a cross-sectional view of an acoustic wave resonator in accordance with a fifth variation of the second embodiment. As illustrated in FIG. 18C, the film thickness T32 of the silicon oxide film 18 in the edge region 54 is approximately equal to the film thickness T31 of the silicon oxide film 18 in the center region 52. Protruding portions 63 are located on the upper surface of the silicon oxide film 18 in the edge regions 54. Other structures are the same as those of the sixth variation of the first embodiment, and the description thereof is thus omitted.

Sixth Variation of the Second Embodiment

Figure 19:
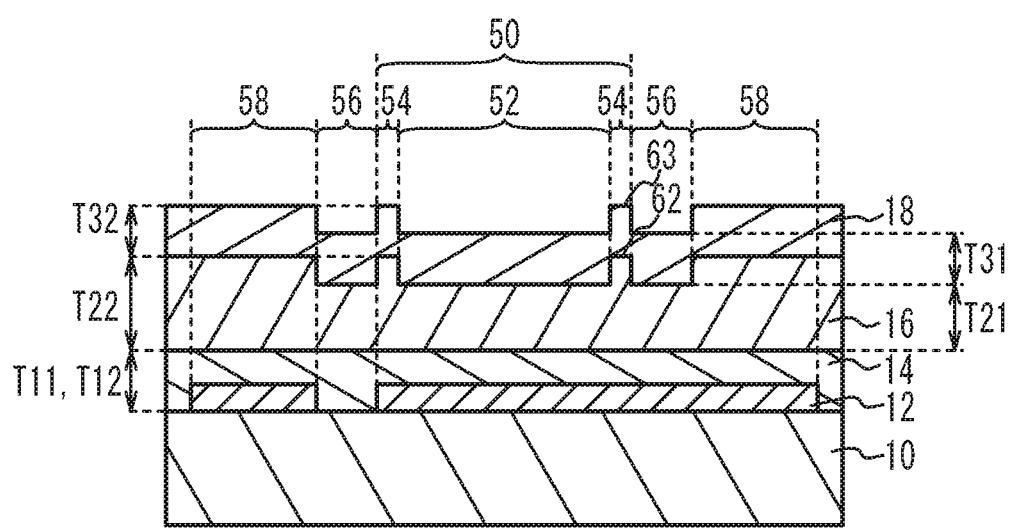
FIG. 19 is a cross-sectional view of an acoustic wave resonator in accordance with a sixth variation of the second embodiment.

FIG. 19 is a cross-sectional view of an acoustic wave resonator in accordance with a sixth variation of the second embodiment. As illustrated in FIG. 19, the film thickness T12 of the silicon oxide film 14 in the edge region 54 is approximately equal to the film thickness T11 of the silicon oxide film 14 in the center region 52. The film thickness T22 of the silicon oxide film 16 in the edge region 54 is greater than the film thickness T21 of the silicon oxide film 16 in the center region 52. This structure forms the protruding portions 62 on the upper surface of the silicon oxide film 16 in the edge regions 54. The film thickness T32 of the silicon oxide film 18 in the edge region 54 is approximately equal to the film thickness T31 of the silicon oxide film 18 in the center region 52. This structure forms the protruding portions 63 on the upper surface of the silicon oxide film 18 in the edge regions 54. Other structures are the same as those of the third variation of the second embodiment, and the description thereof is thus omitted.

In the second embodiment and the variations thereof, the silicon oxide films 14, 16, and 18 are formed on the electrode fingers 26 in the overlap region 50. The silicon oxide film 18 (a third silicon oxide film) has a concentration of the added element or added molecule greater than that in the silicon oxide film 14 and less than that in the silicon oxide film 16. The film thickness T32 of the silicon oxide film 18 in at least a part of the edge region 54 is equal to or less than the film thickness T31 of the silicon oxide film 18 in the center region 52. As described above, even when the silicon oxide film 18 is provided in the first embodiment and the variations thereof, the acoustic velocity of the surface acoustic wave in the edge region 54 is less than that in the center region 52, and lateral-mode spurious is thus reduced. Therefore, unnecessary waves due to unevenness is reduced. Furthermore, the deterioration of the frequency temperature characteristic is reduced.

In the second embodiment and the first and second variations thereof, the silicon oxide film 18 is located between the silicon oxide film 14 and the silicon oxide film 16. In the third through sixth variations of the second embodiment, the silicon oxide film 18 is located on the silicon oxide films 14 and 16. In this case, the silicon oxide film 18 may be used as a frequency adjusting film.

In the second embodiment and the first and third variations thereof, the upper surfaces of the silicon oxide films 16 and 18 are exposed to the air, and are substantially flat to the extent of manufacturing error. Thus, unnecessary waves due to the unevenness of the upper surface are reduced.

The silicon oxide film 18 may be located between the silicon oxide films 14 and 16 and the piezoelectric substrate 10. It is sufficient if the silicon oxide film 18 is located in the overlap region 50, and no silicon oxide film 18 may be located in the gap region 56 and/or the bus bar region 58.

The concentration of the added element or added molecule may consecutively vary in the silicon oxide film 18. Alternatively, the concentration of the added element or added molecule in the silicon oxide film 18 may vary in stages.

Third Embodiment

Figure 20A:
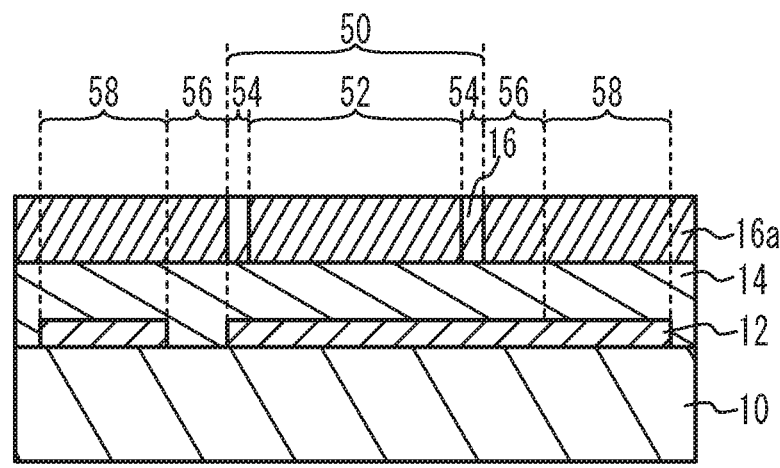
FIG. 20A and FIG. 20B are cross-sectional views of acoustic wave resonators in accordance with a third embodiment and a first variation thereof, respectively.

A third embodiment varies the concentration of the added element or added molecule in the plane of the silicon oxide film. FIG. 20A is a cross-sectional view of an acoustic wave resonator in accordance with the third embodiment. As illustrated in FIG. 20A, the silicon oxide film 14 is located on the piezoelectric substrate 10. Silicon oxide films 16 and 16a are located on the silicon oxide film 14. The silicon oxide film 16 is located in the edge regions 54, and the silicon oxide film 16a is located in the center region 52, the gap regions 56, and the bus bar regions 58. The concentration of the element or molecule in the silicon oxide film 16 is greater than that in the silicon oxide film 16a.

The silicon oxide film 16 and 16a are formed as a single film, and thereafter, the concentration of the element or molecule is made to be different between the silicon oxide film 16 and 16a in the plane. Examples of the method for making the concentration of the element and molecule different in the plan include, but are not limited to, ion implantation.

First Variation of the Third Embodiment

Figure 20B:
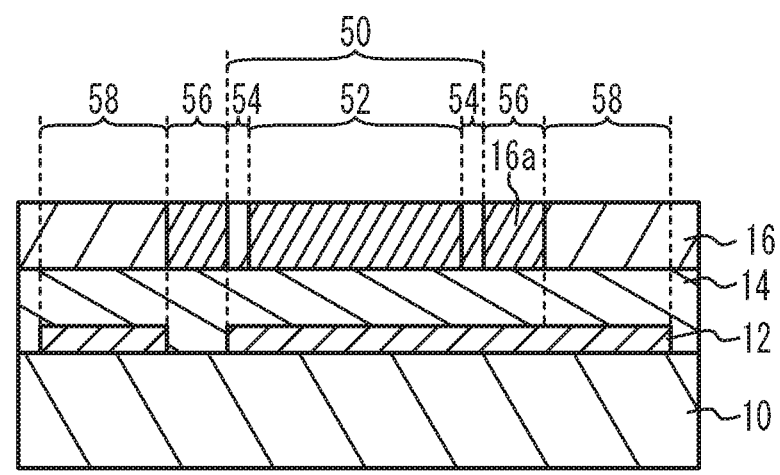

FIG. 20B is a cross-sectional view of an acoustic wave resonator in accordance with a first variation of the third embodiment. As illustrated in FIG. 20B, the silicon oxide film 16 is located in the bus bar regions 58. Other structures are the same as those of the third embodiment, and the description thereof is thus omitted.

Second Variation of the Third Embodiment

Figure 21A:
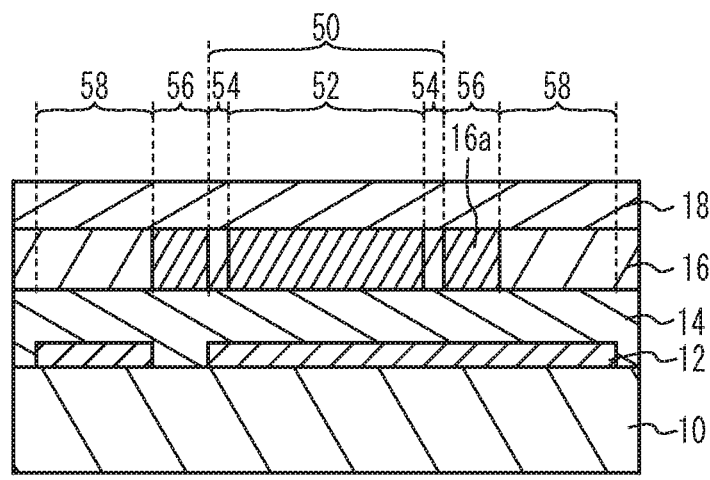
FIG. 21A through FIG. 21C are cross-sectional views of acoustic wave resonators in accordance with second through fourth variations of the third embodiment, respectively.

FIG. 21A is a cross-sectional view of an acoustic wave resonator in accordance with a second variation of the third embodiment. As illustrated in FIG. 21A, the silicon oxide film 18 is located on the silicon oxide films 16 and 16a. The concentration of the element or molecule in the silicon oxide film 18 is greater than that in the silicon oxide film 14 and less than that in the silicon oxide film 16. Other structures are the same as those of the first variation of the third embodiment, and the description thereof is thus omitted.

Third Variation of the Third Embodiment

Figure 21B:
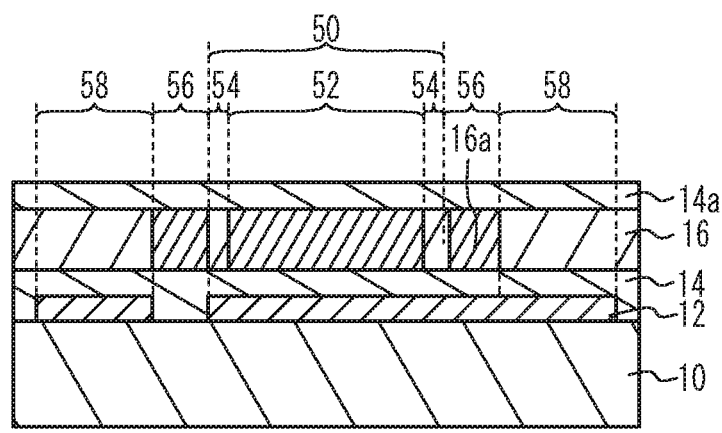

FIG. 21B is a cross-sectional view of an acoustic wave resonator in accordance with a third variation of the third embodiment. As illustrated in FIG. 21B, a silicon oxide film 14a is located on the silicon oxide films 16 and 16a. The concentration of the element or molecule in the silicon oxide film 14a is equal to that in the silicon oxide film 14 (for example, the element or molecule is not intentionally substantially contained). Other structures are the same as those of the first variation of the third embodiment, and the description thereof is thus omitted.

Fourth Variation of the Third Embodiment

Figure 21C:
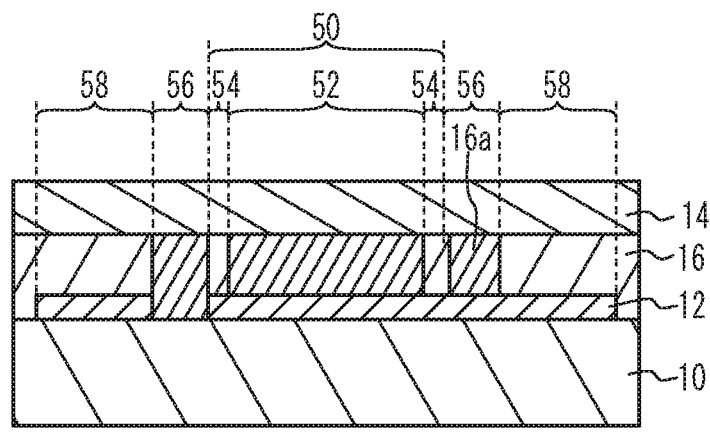

FIG. 21C is a cross-sectional view of an acoustic wave resonator in accordance with a fourth variation of the third embodiment. As illustrated in FIG. 21C, the silicon oxide films 16 and 16a are located between the silicon oxide film 14 and the piezoelectric substrate 10. Other structures are the same as those of the first variation of the third embodiment, and the description thereof is thus omitted.

In the third embodiment and the variations thereof, the silicon oxide film 16a is used as a first silicon oxide film and/or a third silicon oxide film. This structure enables to achieve the advantage identical to those of the first and second embodiments and the variations thereof.

Fourth Embodiment

Figure 22A:
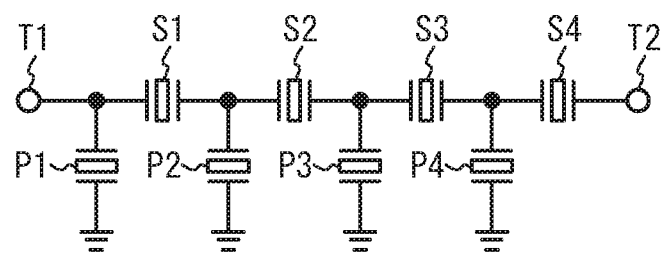
FIG. 22A is a circuit diagram of a filter in accordance with a fourth embodiment.

A fourth embodiment is an exemplary filter and an exemplary duplexer each including the acoustic wave resonator according to any one of the first through third embodiments and the variations thereof. FIG. 22A is a circuit diagram of a filter in accordance with the fourth embodiment. As illustrated in FIG. 22A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 can be the acoustic wave resonator according to any one of the first through third embodiments and the variations thereof. The number of resonators in the ladder-type filter can be appropriately set.

First Variation of the Fourth Embodiment

Figure 22B:
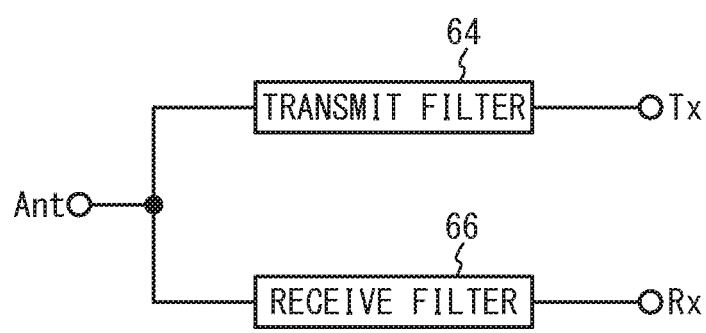
FIG. 22B is a circuit diagram of a duplexer in accordance with a first variation of the fourth embodiment.

FIG. 22B is a circuit diagram of a duplexer in accordance with a first variation of the fourth embodiment. As illustrated in FIG. 22B, a transmit filter 64 is connected between a common terminal Ant and a transmit terminal Tx. A receive filter 66 is connected between the common terminal Ant and a receive terminal Rx. The transmit filter 64 transmits signals in the transmit band to the common terminal Ant as transmission signals among signals input from the transmit terminal Tx, and suppresses signals with other frequencies. The receive filter 66 transmits signals in the receive band to the receive terminal Rx as reception signals among signals input from the common terminal Ant, and suppresses signals with other frequencies. At least one of the transmit filter 64 and the receive filter 66 can be the filter of the fourth embodiment.

The filter includes the acoustic wave resonator according to any one of the first through third embodiments and the variations thereof. Accordingly, ripples due to lateral-mode spurious are reduced, and the frequency temperature characteristic is improved. In addition, at least one of the transmit filter 64 and the receive filter 66 can be the filter including the acoustic wave resonator according to any one of the first through third embodiments and the variations thereof. The duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
    a piezoelectric substrate;
    an IDT that is located on the piezoelectric substrate, and includes a pair of comb-shaped electrodes facing each other, each of the pair of comb-shaped electrodes including electrode fingers, which excite an acoustic wave, and a bus bar connecting the electrode fingers;
    a first silicon oxide film located on the electrode fingers in an overlap region where the electrode fingers of the pair of comb-shaped electrodes overlap, a film thickness of the first silicon oxide film in at least a part of at least one of edge regions being equal to or less than a film thickness of the first silicon oxide film in a center region, the edge regions corresponding to both ends of the overlap region in an extension direction of the electrode fingers, the center region being sandwiched between the edge regions within the overlap region; and
    a second silicon oxide film that is located on the electrode fingers in the overlap region and contains an element or molecule that slows an acoustic velocity in a silicon oxide film when being added to the silicon oxide film, a concentration of the element or molecule in the second silicon oxide film being greater than that in the first silicon oxide film, and a film thickness of the second silicon oxide film in at least a part of at least one of the edge regions being greater than a film thickness of the second silicon oxide film in the center region.

2. The acoustic wave resonator according to claim 1, wherein
    the element or molecule is at least one of F, H, $CH_3$, $CH_2$, Cl, C, N, P, B, and S.

3. The acoustic wave resonator according to claim 1, wherein
    the element or molecule is F.

4. The acoustic wave resonator according to claim 1, wherein
    the first silicon oxide film does not substantially contain the element or molecule.

5. The acoustic wave resonator according to claim 1, wherein
    the first silicon oxide film contains the element or molecule.

6. The acoustic wave resonator according to claim 1, wherein
    an upper surface of a silicon oxide film that is at least one of the first silicon oxide film and the second silicon oxide film that is exposed to air is substantially flat.

7. The acoustic wave resonator according to claim 1, wherein
    the second silicon oxide film is located on at least a part of the bus bar.

8. The acoustic wave resonator according to claim 1, wherein
    in the edge region, the second silicon oxide film is thicker than the first silicon oxide film.

9. The acoustic wave resonator according to claim 1, wherein
    the first silicon oxide film is in contact with the second silicon oxide film.

10. The acoustic wave resonator according to claim 1, further comprising
    a third silicon oxide film that is located on the electrode fingers in the overlap region, a concentration of the element or molecule in the third silicon oxide film being greater the concentration of the element or molecule in the first silicon oxide film and less than the concentration of the element or molecule in the second silicon oxide film, a film thickness of the third silicon oxide film in at least a part of at least one of the edge regions being equal to or less than a film thickness of the third silicon oxide film in the center region.

11. The acoustic wave resonator according to claim 10, wherein
the third silicon oxide film is located between the first silicon oxide film and the second silicon oxide film.

12. The acoustic wave resonator according to claim 10, wherein
the third silicon oxide film is located on the first silicon oxide film and the second silicon oxide film.

13. The acoustic wave resonator according to claim 12, wherein
an upper surface of the third silicon oxide film is exposed to air and is substantially flat.

14. The acoustic wave resonator according to claim 1, wherein
the piezoelectric substrate is a lithium niobate substrate or a lithium tantalate substrate.

15. A filter comprising:
an acoustic wave resonator including:
  a piezoelectric substrate;
  an IDT that is located on the piezoelectric substrate, and includes a pair of comb-shaped electrodes facing each other, each of the pair of comb-shaped electrodes including electrode fingers, which excite an acoustic wave, and a bus bar connecting the electrode fingers;
  a first silicon oxide film located on the electrode fingers in an overlap region where the electrode fingers of the pair of comb-shaped electrodes overlap, a film thickness of the first silicon oxide film in at least a part of at least one of edge regions being equal to or less than a film thickness of the first silicon oxide film in a center region, the edge regions corresponding to both ends of the overlap region in an extension direction of the electrode fingers, the center region being sandwiched between the edge regions within the overlap region; and
  a second silicon oxide film that is located on the electrode fingers in the overlap region and contains an element or molecule that slows an acoustic velocity in a silicon oxide film when being added to the silicon oxide film, a concentration of the element or molecule in the second silicon oxide film being greater than that in the first silicon oxide film, and a film thickness of the second silicon oxide film in at least a part of at least one of the edge regions being greater than a film thickness of the second silicon oxide film in the center region.

16. A multiplexer comprising:
a filter including an acoustic wave resonator, wherein
the acoustic wave resonator includes:
  a piezoelectric substrate;
  an IDT that is located on the piezoelectric substrate, and includes a pair of comb-shaped electrodes facing each other, each of the pair of comb-shaped electrodes including electrode fingers, which excite an acoustic wave, and a bus bar connecting the electrode fingers;
  a first silicon oxide film located on the electrode fingers in an overlap region where the electrode fingers of the pair of comb-shaped electrodes overlap, a film thickness of the first silicon oxide film in at least a part of at least one of edge regions being equal to or less than a film thickness of the first silicon oxide film in a center region, the edge regions corresponding to both ends of the overlap region in an extension direction of the electrode fingers, the center region being sandwiched between the edge regions within the overlap region; and
  a second silicon oxide film that is located on the electrode fingers in the overlap region and contains an element or molecule that slows an acoustic velocity in a silicon oxide film when being added to the silicon oxide film, a concentration of the element or molecule in the second silicon oxide film being greater than that in the first silicon oxide film, and a film thickness of the second silicon oxide film in at least a part of at least one of the edge regions being greater than a film thickness of the second silicon oxide film in the center region.

* * * * *